(12) United States Patent
Oda et al.

(10) Patent No.: US 12,290,883 B2
(45) Date of Patent: May 6, 2025

(54) BONDING WIRE

(71) Applicant: NIPPON MICROMETAL CORPORATION, Saitama (JP)

(72) Inventors: Daizo Oda, Saitama (JP); Motoki Eto, Saitama (JP); Ryo Oishi, Saitama (JP)

(73) Assignee: NIPPON MICROMETAL CORPORATION, Saitama (JP)

( * ) Notice: Subject to any disclaimer, the term of this patent is extended or adjusted under 35 U.S.C. 154(b) by 0 days.

(21) Appl. No.: 18/855,536

(22) PCT Filed: Jun. 27, 2023

(86) PCT No.: PCT/JP2023/023777
§ 371 (c)(1),
(2) Date: Oct. 9, 2024

(87) PCT Pub. No.: WO2024/247286
PCT Pub. Date: Dec. 5, 2024

(65) Prior Publication Data
US 2025/0114877 A1  Apr. 10, 2025

(30) Foreign Application Priority Data
May 30, 2023 (JP) .................. 2023-088808

(51) Int. Cl.
B23K 35/02 (2006.01)
B23K 20/00 (2006.01)
(Continued)

(52) U.S. Cl.
CPC ........ B23K 35/0261 (2013.01); B23K 35/302 (2013.01); *B23K 20/004* (2013.01); *B23K 2101/40* (2018.08)

(58) Field of Classification Search
CPC .............. B23K 35/0261; B23K 35/302; B23K 20/004; B23K 2101/40
See application file for complete search history.

(56) References Cited

U.S. PATENT DOCUMENTS 9,773,748 B2  9/2017  Yamada et al.
10,137,534 B2  11/2018  Yamada et al.
(Continued)

FOREIGN PATENT DOCUMENTS

CN  102884615 A  1/2013
JP  S61-048543 A  3/1986
(Continued)

OTHER PUBLICATIONS

Decision to Grant dated Nov. 8, 2024, from corresponding Korean Patent Application No. KR10-2024-7023494, 5 pages (non-English).

(Continued)

*Primary Examiner* — Robert G Bachner
(74) *Attorney, Agent, or Firm* — Rimon P.C.

(57) ABSTRACT

There is provided a novel alloy-coated Cu bonding wire that achieves a favorable FAB shape and also a favorable initial bondability of a 2nd bonding part including adhesion of the 2nd bonding part, and that reduces a galvanic corrosion in a high-temperature environment to achieve a favorable bond reliability of the 2nd bonding part. The alloy-coated Cu bonding wire includes a core material of Cu or Cu alloy, and a coating layer having a total concentration of Pd and Ni of 90 atomic % or more formed on a surface of the core material. The bonding wire is characterized in that:

in a concentration profile in a depth direction of the wire obtained by performing measurement using Auger electron spectroscopy (AES) so that the number of measurement points in the depth direction is 50 or more for the coating layer, a thickness of the coating layer is 10 nm or more and 130 nm or less, an average value X is 0.1 or more and 35.0 or less, the average value X being defined as an average value of (Continued)

a ratio of a Pd concentration $C_{Pd}$ (atomic %) to an Ni concentration $C_{Ni}$ (atomic %), $C_{Pd}/C_{Ni}$, for all measurement points in the coating layer, the total number of measurement points in the coating layer whose absolute deviation from the average value X is 0.3X or less is 50% or more relative to the total number of measurement points in the coating layer, and the bonding wire satisfies the following condition (A):

(A) the bonding wire contains one or more elements selected from the group consisting of Ti, V, Cr, Mn, Fe, Co, Zn, Zr, Nb, Mo, Ru, Rh, Sn, Ta, W, Os, Ir, Pt, Au and Bi (hereinafter referred to as "first additive element"), and the total concentration of the first additive element relative to the entire wire is 5 ppm by mass or more and 450 ppm by mass or less.

16 Claims, 3 Drawing Sheets

(51) Int. Cl.
  *B23K 35/30*   (2006.01)
  *B23K 101/40*  (2006.01)

(56) References Cited

U.S. PATENT DOCUMENTS

| | | |
|---|---|---|
| 10,414,002 B2 | 9/2019 | Yamada et al. |
| 10,468,370 B2 | 11/2019 | Yamada et al. |
| 10,610,976 B2 | 4/2020 | Yamada et al. |
| 10,737,356 B2 | 8/2020 | Yamada et al. |
| 11,373,934 B2 | 6/2022 | Oda et al. |
| 11,721,660 B2 | 8/2023 | Oda et al. |
| 11,929,343 B2 | 3/2024 | Oda et al. |
| 2007/0235887 A1 | 10/2007 | Kaimori et al. |
| 2017/0200689 A1 | 7/2017 | Yamada et al. |
| 2017/0216974 A1 | 8/2017 | Yamada et al. |
| 2018/0130763 A1 | 5/2018 | Yamada et al. |
| 2018/0133843 A1 | 5/2018 | Yamada et al. |
| 2020/0013748 A1 | 1/2020 | Yamada et al. |
| 2020/0312808 A1 | 10/2020 | Oda et al. |
| 2020/0373226 A1 | 11/2020 | Oda et al. |
| 2023/0018430 A1 | 1/2023 | Oda et al. |
| 2023/0215834 A1 | 7/2023 | Oda et al. |
| 2023/0245995 A1 | 8/2023 | Oda et al. |
| 2023/0335528 A1 | 10/2023 | Oda et al. |
| 2023/0387066 A1 | 11/2023 | Oda et al. |

FOREIGN PATENT DOCUMENTS

| | | |
|---|---|---|
| JP | 2005-167020 A | 6/2005 |
| JP | 2013-131654 A | 7/2013 |
| JP | 2018-503743 A | 2/2018 |
| JP | 7157279 B1 | 10/2022 |
| KR | 1020180005652 A | 1/2018 |
| KR | 1020200070424 A | 6/2020 |
| KR | 1020230001011 A | 1/2023 |
| KR | 1020230001012 A | 1/2023 |
| TW | 201315821 A | 4/2013 |
| TW | 202307225 A | 2/2023 |
| WO | 2011/129256 A1 | 10/2011 |
| WO | 2017/013796 A1 | 1/2017 |
| WO | 2017/221770 A1 | 12/2017 |

OTHER PUBLICATIONS

International Search Report and Written Opinion received in International Application No. PCT/JP2023/023777, dated Sep. 12, 2023.
Office Action received in Taiwanese Application No. 112124502, dated Jul. 5, 2024, w/ English Translation.

BONDING WIRE

CROSS-REFERENCE TO RELATED APPLICATIONS

This application is the U.S. National Phase under 35 U.S.C. § 371 of International Application No. PCT/JP2023/023777, filed on Jun. 27, 2023, which claims the benefit of foreign priority to Japanese Patent Application No. 2023-088808 filed on May 30, 2023, the entire contents of each of which are hereby incorporated by reference.

TECHNICAL FIELD

The present invention relates to a bonding wire.

BACKGROUND ART

A bonding wire is used to connect electrodes formed on a semiconductor chip and a lead frame or electrodes on a substrate. A bonding process of the bonding wire is carried out by performing 1st bonding of a wire part onto an electrode on the semiconductor chip; forming a loop; and finally performing 2nd bonding of a wire part onto an external terminal such as the lead frame or the electrode on the substrate. In the bonding process, a cylindrical bonding tool (capillary) is used for bonding by inserting the bonding wire therethrough. Specifically, in the 1st bonding, a tip end of wire part extended from the capillary (hereinafter also referred to as "tail") is heated and melted by arc heat input to form a free air ball (FAB; Free Air Ball; hereinafter also simply referred to as "ball") through surface tension, and then this ball part is compression-bonded (hereinafter also referred to as "ball-bonded") onto the electrode on the semiconductor chip. Further, in the 2nd bonding, the wire part is compression-bonded (hereinafter also referred to as "wedge-bonded") onto the external terminal by applying ultrasonic waves and load from the capillary to the wire part without forming the ball.

Gold (Au) has been the common material of the bonding wire, but has been being replaced with copper (Cu) mainly for LSI use (e.g., Patent Literatures 1 to 3). Meanwhile, for on-vehicle device use on the background of recent proliferation of electric vehicles and hybrid vehicles, and further for power device (power semiconductor device) use in large power equipment such as air conditioners and photovoltaic power generation systems, there has been a growing demand for replacement with Cu that has high efficiency and reliability due to its high thermal conductivity and fusing current characteristic.

Cu has the drawback of being more susceptible to oxidation than Au. As a method of preventing the surface oxidation of the Cu bonding wire, there has been proposed a structure in which a surface of a Cu core material is coated with a metal such as Pd (Patent Literature 4). There has been also proposed a Pd-coated Cu bonding wire which has an improved bond reliability of the 1st bonding part by coating a surface of a Cu core material with Pd and adding Pd and Pt into the Cu core material (Patent Literature 5).

RELATED ART REFERENCE

Patent Literature

Patent Literature 1: JP-A-S61-48543
Patent Literature 2: JP-T-2018-503743
Patent Literature 3: WO 2017/221770
Patent Literature 4: JP-A-2005-167020
Patent Literature 5: WO 2017/013796

SUMMARY OF INVENTION

Problem to be Solved by the Invention

In recent years, the bonding wire has been required to exhibit a favorable bond reliability under a rigorous high-temperature environment.

The present inventors have conducted the evaluation based on such demands in recent years and found that, in a conventional Cu bonding wire having a Pd-coating layer, the Pd-coating layer may sometimes be partially exfoliated during the bonding process of the wire, thereby causing exposure of the Cu core material, and as a result, a contact area between the Pd-coating part and the Cu-exposed part is exposed to an environment containing oxygen, water vapor and sulfur compound-based outgas, which are generated from a sealing resin under a high-temperature environment. This exposure results in local corrosion of Cu, that is, galvanic corrosion, which makes it less likely to sufficiently achieve the bond reliability of the 2nd bonding part. On the other hand, a bare Cu bonding wire without the Pd-coating layer provides a poor FAB shape and exhibits insufficient bondability of the 1st bonding part, although galvanic corrosion does not occur.

In the process of addressing the issues described above, it has been confirmed that an alloy-coated Cu bonding wire, in which the surface of a Cu core material is coated with an alloy including Ni and Pd, exhibits favorable results in terms of the FAB shape and the bond reliability in a high-temperature environment, depending on the composition of the alloy coating. However, regarding such an alloy-coated Cu bonding wire, it has been found that there is room for improvement in an adhesion between the wire and the terminal at the 2nd bonding part (hereinafter also simply referred to as "adhesion at the 2nd bonding part"). Hereinafter, in the present specification, the adhesion at the 2nd bonding part and the initial bonding strength at the 2nd bonding part are collectively referred to as the initial bondability of the 2nd bonding part.

An object of the present invention is to provide a novel alloy-coated Cu bonding wire that achieves a favorable FAB shape and also a favorable initial bondability of the 2nd bonding part including the adhesion at the 2nd bonding part, and that reduces a galvanic corrosion in a high-temperature environment to achieve a favorable bond reliability of the 2nd bonding part.

Means for Solving Problem

As a result of earnest investigation as to the problem described above, the present inventors have found that the problem described above can be solved by the bonding wire having the configuration described below, and have thereby completed the present invention.

That is, the present invention includes the following content.

<1> A bonding wire comprising:
a core material of Cu or Cu alloy; and
a coating layer having a total concentration of Pd and Ni of 90 atomic % or more formed on a surface of the core material, wherein
in a concentration profile in a depth direction of the wire obtained by performing measurement using Auger electron spectroscopy (AES) so that the number of measurement points in the depth direction is 50 or more for the coating layer, a thickness of the coating layer is 10 nm or more and 130 nm or less, an average value X is 0.1 or more and 35.0 or less where X is defined as an average value of a ratio of a Pd concentration $C_{Pd}$ (atomic %) to an Ni concentration $C_{Ni}$ (atomic %), $C_{Pd}/C_{Ni}$, for all measurement points in the coating layer, a total number of measurement points in the coating layer whose absolute deviation from the average value X is 0.3X or less is 50% or more relative to a total number of measurement points in the coating layer, and the bonding wire satisfies the following condition (A):

(A) the bonding wire contains one or more elements (hereinafter referred to as a "first additive element") selected from the group consisting of Ti, V, Cr, Mn, Fe, Co, Zn, Zr, Nb, Mo, Ru, Rh, Sn, Ta, W, Os, Ir, Pt, Au and Bi, and a total concentration of the first additive element relative to the entire wire is 5 ppm by mass or more and 450 ppm by mass or less.

<2> A bonding wire comprising:

a core material of Cu or Cu alloy; and a coating layer having a total concentration of Pd and Ni of 90 atomic % or more formed on a surface of the core material, wherein in a concentration profile in a depth direction of the wire obtained by performing measurement using Auger electron spectroscopy (AES) so that the number of measurement points in the depth direction is 50 or more for the coating layer, a thickness of the coating layer is 10 nm or more and 130 nm or less, an average value X is 0.1 or more and 35.0 or less where X is defined as an average value of a ratio of a Pd concentration $C_{Pd}$ (atomic %) to an Ni concentration $C_{Ni}$ (atomic %), $C_{Pd}/C_{Ni}$, for all measurement points in the coating layer, a total number of measurement points in the coating layer whose absolute deviation from the average value X is 0.3X or less is 50% or more relative to a total number of measurement points in the coating layer, and the bonding wire satisfies the following conditions (A) and (B):

(A) the bonding wire contains one or more elements (hereinafter referred to as a "first additive element") selected from the group consisting of Ti, V, Cr, Mn, Fe, Co, Zn, Zr, Nb, Mo, Ru, Rh, Sn, Ta, W, Os, Ir, Pt, Au and Bi, and the total concentration of the first additive element relative to the entire wire (provided that, the concentration of Au is the concentration thereof in the core material part) is 5 ppm by mass or more and 450 ppm by mass or less; and (B) the bonding wire contains Au at a surface of the wire, and a concentration of Au relative to the entire wire is 0.5% by mass or less.

<3> The bonding wire according to <1> or <2>, wherein the total number of measurement points in the coating layer whose absolute deviation from the average value X is 0.2X or less is 50% or more relative to the total number of the measurement points in the coating layer.

<4> The bonding wire according to any one of <1> to <3>, wherein when linearly approximating $C_{Pd}$ or $C_{Ni}$ by the method of least squares for all measurement points in the coating layer, a difference between a maximum value and a minimum value of the obtained approximate straight line in a depth range of the coating layer is 20 atomic % or less.

<5> The bonding wire according to any one of <1> to <4>, wherein the concentration profile in the depth direction of the wire is obtained by performing the measurement using AES under the following <Condition> while digging down the wire from its surface in the depth direction by Ar sputtering:

<Condition> a center of width of a measuring surface is aligned with a center of width of the wire, the width of the measuring surface is 5% or more and 15% or less of a diameter of the wire, and a length of the measuring surface is five times the width of the measuring surface.

<6> The bonding wire according to any one of <1> to <5>, wherein the bonding wire contains one or more elements selected from the group consisting of B, P and Mg (hereinafter referred to as a "second additive element"), and a total concentration of the second additive element is 1 ppm by mass or more and 100 ppm by mass or less relative to the entire wire.

<7> The bonding wire according to any one of <1> to <6>, wherein the bonding wire contains one or more elements selected from the group consisting of Se, Te, As and Sb (hereinafter referred to as a "third additive element"), and a total concentration of the third additive element is 1 ppm by mass or more and 100 ppm by mass or less relative to the entire wire.

<8> The bonding wire according to any one of <1> to <7>, wherein the bonding wire contains one or more elements selected from the group consisting of Ga and Ge (hereinafter referred to as a "fourth additive element"), and a total concentration of the fourth additive element is 0.011% by mass or more and 1.5% by mass or less relative to the entire wire.

<9> The bonding wire according to any one of <1> to <8>, wherein the bonding wire contains one or more elements selected from the group consisting of In and Ag (hereinafter referred to as a "fifth additive element"), and a total concentration of the fifth additive element is 1 ppm by mass or more and 500 ppm by mass or less relative to the entire wire.

Effect of the Invention

The present invention can provide a novel alloy-coated Cu bonding wire that achieves a favorable FAB shape and also a favorable initial bondability of the 2nd bonding part including the adhesion at the 2nd bonding part, and that reduces a galvanic corrosion in a high-temperature environment to achieve a favorable bond reliability of the 2nd bonding part.

BRIEF DESCRIPTION OF DRAWINGS

FIG. 1 is also the schematic view illustrating a position of an evaluation surface (cross section) for evaluating adhesion at the 2nd bonding part.

EMBODIMENT FOR CARRYING OUT THE INVENTION

Figure 1:
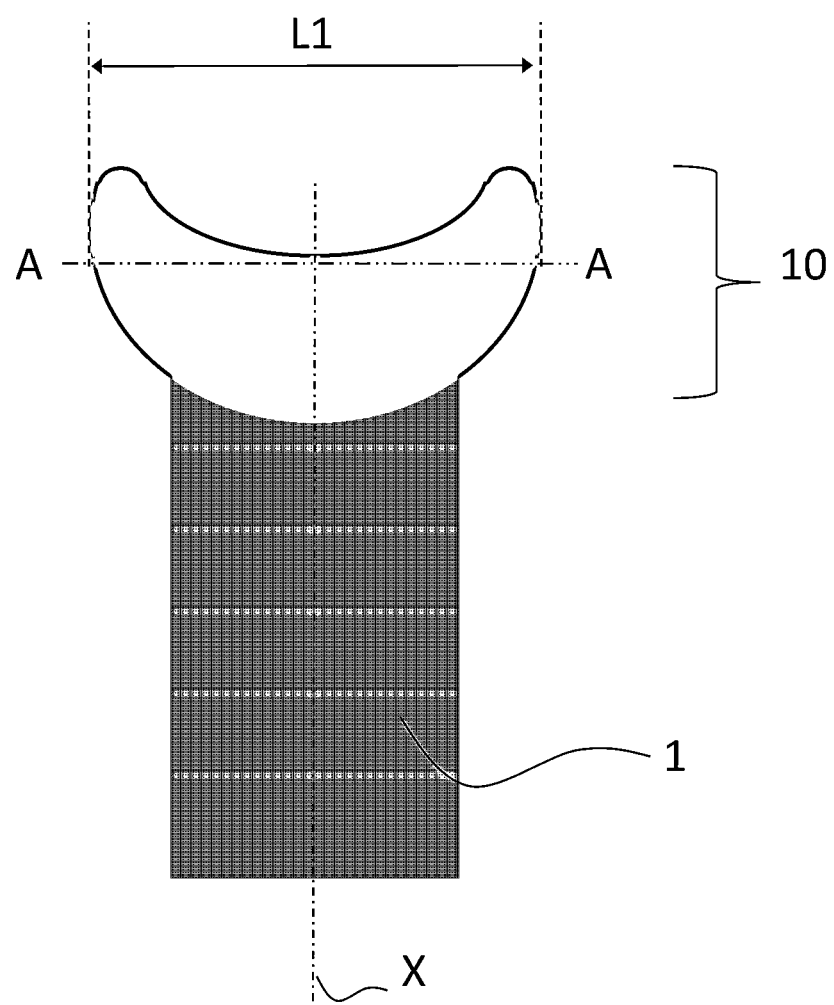
FIG. 1 is a schematic view illustrating a 2nd bonding part.

Hereinafter, the present invention will be described in detail with reference to preferable embodiments thereof. Drawings may be referred to during the explanation. However, note that each drawing schematically shows the shape, size and arrangement of constituent elements only to the extent that the invention can be understood. The present invention is not limited to the following embodiments and examples and may be modified for implementation within the scope not departing from the scope of claims of the present invention and their equivalents.

[Bonding Wire]

A bonding wire according to the present invention (hereinafter also simply referred to as "wire of the present invention" or "wire") is characterized in that the bonding wire includes:

a core material of Cu or Cu alloy; and
a coating layer having a total concentration of Pd and Ni of 90 atomic % or more formed on a surface of the core material, wherein
in a concentration profile in a depth direction of the wire obtained by performing measurement using Auger electron spectroscopy (AES) so that the number of measurement points in the depth direction is 50 or more for the coating layer,
a thickness of the coating layer is 10 nm or more and 130 nm or less,
an average value X is 0.1 or more and 35.0 or less where X is defined as an average value of a ratio of a Pd concentration $C_{Pd}$ (atomic %) to an Ni concentration $C_{Ni}$ (atomic %), $C_{Pd}/C_{Ni}$, for all measurement points in the coating layer, and
a total number of measurement points in the coating layer whose absolute deviation from the average value X is 0.3X or less is 50% or more relative to a total number of measurement points in the coating layer; and
the bonding wire satisfies the following condition (A):
(A) the bonding wire contains one or more elements ("first additive element") selected from the group consisting of Ti, V, Cr, Mn, Fe, Co, Zn, Zr, Nb, Mo, Ru, Rh, Sn, Ta, W, Os, Ir, Pt, Au and Bi, and the total concentration of the first additive element relative to the entire wire is 5 ppm by mass or more and 450 ppm by mass or less.

As described above, in recent years, the bonding wires are required to exhibit a favorable bond reliability under a rigorous high-temperature environment. For example, the bonding wires used for the on-vehicle devices require a bond reliability in a high-temperature environment exceeding 150° C. The present inventors have conducted an evaluation based on the recent demands and found that, in some cases, the conventional Cu bonding wires with the Pd-coating layers cause a galvanic corrosion in a high-temperature environment and fail to sufficiently achieve the bond reliability at the 2nd bonding parts. Furthermore, the bare Cu bonding wire without the Pd-coating layer does not cause a galvanic corrosion, but provides a poor FAB shape and consequently an inferior bonded ball shape of the 1st bonding part and thus cannot be sufficiently applied for a fine-pitch bonding required for high-density packaging.

In contrast, the present inventors have found that a favorable FAB shape can be achieved and a galvanic corrosion in a high-temperature environment can be reduced to achieve a favorable bond reliability of the 2nd bonding part, by using an alloy-coated Cu bonding wire that includes:

a core material of Cu or Cu alloy; and
a coating layer having a total concentration of Pd and Ni of 90 atomic % or more formed on a surface of the core material, wherein
in a concentration profile in a depth direction of the wire obtained by performing measurement using AES so that the number of measurement points in the depth direction is 50 or more for the coating layer,
a thickness of the coating layer is 10 nm or more and 130 nm or less,
an average value X is 0.1 or more and 35.0 or less where X is defined as an average value of a ratio of a Pd concentration $C_{Pd}$ (atomic %) to an Ni concentration $C_{Ni}$ (atomic %), $C_{Pd}/C_{Ni}$, for all measurement points in the coating layer, and
a total number of measurement points in the coating layer whose absolute deviation from the average value X is 0.3X or less is 50% or more relative to a total number of measurement points in the coating layer.

On the other hand, regarding such an alloy-coated Cu bonding wire, it has been found that there is room for improvement in the initial bondability of the 2nd bonding part, particularly in the adhesion at the 2nd bonding part, as described below.

As described above, in the 2nd bonding, the wire part is compression-bonded onto the external terminal by applying ultrasonic waves and load from the capillary to the wire part. FIG. 1 shows a schematic view of the 2nd bonding part formed on the external terminal (not shown), viewed from directly above in a direction perpendicular to the main surface of the external terminal. In FIG. 1, a 2nd bonding part 10 is formed at a tip end of a wire 1.

Figure 2:
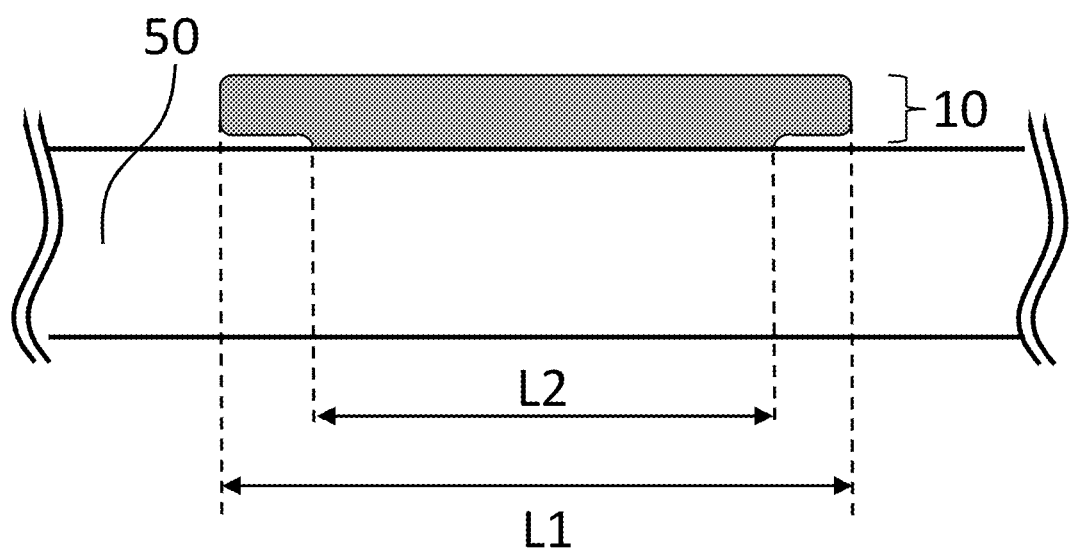
FIG. 2 is a schematic cross-sectional view of the 2nd bonding part when cut at a position indicated by a two-dot chain line A-A in FIG. 1.

It is desirable that the wire and the external terminal are sufficiently adhered with each other at the 2nd bonding part. However, regarding the 2nd bonding part formed using the alloy-coated Cu bonding wire described above, it has been confirmed that the places where the wire and the external terminal are not adhered with each other at a certain rate, resulting in the poor adhesion between the wire and the terminal. FIG. 2 shows a schematic cross-sectional view of the 2nd bonding part when cut at the position indicated by the two-dot chain line A-A in FIG. 1 in the direction perpendicular to the main surface of the external terminal. In FIG. 2, the 2nd bonding part 10 is formed on an external terminal 50. Regarding the 2nd bonding part formed using the alloy-coated Cu bonding wire described above, the present inventors have found that there tend to be the places where the wire and the external terminal are not adhered within a certain width from ends of the 2nd bonding part (left end and right end of the 2nd bonding part 10 in FIG. 2). Such an adhesion problem at the 2nd bonding part has not been apparent at least with a conventional bonding wire including a bare Cu bonding wire, thus it is likely to be a unique problem caused by adoption of the specific alloy coating described above.

Regarding this issue, the present inventors have found that the bonding wire that adopts the specific alloy coating described above and satisfies the condition (A) described above can improve the adhesion at the 2nd bonding part and achieve a favorable initial bondability of the 2nd bonding part while maintaining the excellent effects exhibited by adopting the specific alloy coating.

<Core Material of Cu or Cu Alloy>

The wire of the present invention includes a core material of Cu or Cu alloy (hereinafter, also simply referred to as "Cu core material").

The Cu core material is not particularly limited as long as it is made of Cu or Cu alloy, and there may be used a known Cu core material constituting a conventional Pd-coated Cu wire which has been known as a bonding wire.

In the present invention, the concentration of Cu in the Cu core material may be, for example, 97 atomic % or more, 97.5 atomic % or more, 98 atomic % or more, 98.5 atomic % or more, 99 atomic % or more, 99.5 atomic % or more, 99.8 atomic % or more, 99.9 atomic % or more, or 99.95 atomic % or more in the center (axial core part) of the Cu core material.

From the viewpoint of achieving the alloy-coated Cu bonding wire that improves the adhesion at the 2nd boding part and exhibits a favorable initial bondability of the 2nd bonding part, the Cu core material preferably contains a first additive element so as to satisfy the condition (A) described above.

The Cu core material may contain one or more dopants selected from a second additive element, a third additive element, a fourth additive element and a fifth additive element, described later, for example. Preferable contents of these dopants are described later.

In an embodiment, the Cu core material consists of Cu, the first additive element, and inevitable impurities. In another embodiment, the Cu core material consists of Cu, the first additive element, one or more elements selected from the second additive element, the third additive element, the fourth additive element and the fifth additive element, described later, and inevitable impurities. Note that the Cu core material may contain elements constituting the coating layer described below.

<Coating Layer>

The wire of the present invention includes a coating layer having a total concentration of Pd and Ni of 90 atomic % or more (hereinafter, also simply referred to as a "coating layer") formed on a surface of the Cu core material.

In view of achieving a favorable FAB shape and reducing a galvanic corrosion in a high-temperature environment to achieve a favorable bond reliability of the 2nd bonding part, it is important for the coating layer of the wire of the present invention to satisfy all of the following conditions (1) to (3) in a concentration profile in the depth direction of the wire obtained by performing measurement using AES so that the number of measurement points in the depth direction is 50 or more for the coating layer (hereinafter also simply referred to as "concentration profile in the depth direction of the wire").

(1) A thickness of the coating layer is 10 nm or more and 130 nm or less.

(2) An average value X is 0.1 or more and 35.0 or less where X is defined as an average value of a ratio of a Pd concentration $C_{Pd}$ (atomic %) to an Ni concentration $C_{Ni}$ (atomic %), $C_{Pd}/C_{Ni}$, for all measurement points in the coating layer.

(3) The total number of measurement points in the coating layer whose absolute deviation from the average value X is 0.3X or less is 50% or more relative to the total number of measurement points in the coating layer.

In the present invention, when obtaining the concentration profile in the depth direction of the wire by using AES, the measurement is performed so that the number of measurement points in the depth direction is 50 or more for the coating layer. In general, an analysis in the depth direction using AES can be performed at measurement intervals of sub-nano order, thus it is relatively easy to set the number of the measurement points to 50 or more in relation to the thickness of the coating layer of the present invention. If the number of the measurement points is less than 50 as a result of the measurement, the number of the measurement points is increased to 50 or more by lowering the sputtering rate, shortening the sputtering time, and the like, and then the measurement is performed again. This makes it possible to perform the measurement using AES so that the number of measurement points in the depth direction is 50 or more for the coating layer and obtain the concentration profile in the depth direction of the wire. Although it depends on the thickness of the coating layer, it is more preferable to determine the AES measurement point intervals such that the total number of measurement points in the coating layer becomes 70 or more (more preferably 100 or more). Accordingly, in a preferable embodiment, the coating layer of the wire of the present invention satisfies all of the above-mentioned conditions (1) to (3) in the concentration profile in the depth direction of the wire obtained by performing the measurement using AES so that the number of measurement points in the depth direction is 50 or more for the coating layer.

—Condition (1)—

The condition (1) relates to the thickness of the coating layer. By including the coating layer that satisfies the condition (1) in combination with the conditions (2) and (3), the wire of the present invention can reduce a galvanic corrosion in a high-temperature environment to achieve a favorable bond reliability of the 2nd bonding part and can achieve a favorable FAB shape, and thus a favorable bonded ball shape of the 1st bonding part.

Regarding the condition (1), the thickness of the coating layer (the calculation method based on the concentration profile in the depth direction of the wire will be described below) is, from the viewpoint of achieving a favorable FAB shape, 10 nm or more, preferably 12 nm or more, 14 nm or more, 15 nm or more, 16 nm or more, 18 nm or more, or 20 nm or more, more preferably 25 nm or more, 30 nm or more, 40 nm or more, or 50 nm or more, further preferably 60 nm or more, 70 nm or more, 80 nm or more, or 90 nm or more. When the thickness of the coating layer is less than 10 nm, eccentricity tends to occur during the FAB formation, which deteriorates the FAB shape and the bonded ball shape of the 1st bonding part. Furthermore, the upper limit of the thickness of the coating layer is, from the viewpoint of achieving a favorable FAB shape, 130 nm or less, preferably 125 nm or less, 120 nm or less, 115 nm or less, or 110 nm or less. When the thickness of the coating layer is more than 130 nm, irregular shape and melting failure tend to occur during the FAB formation, which deteriorates the FAB shape and also the bonded ball shape of the 1st bonding part.

—Condition (2)—

The condition (2) relates to the average value X of the ratio of the Pd concentration $C_{Pd}$ (atomic %) to the Ni concentration $C_{Ni}$ (atomic %), $C_{Pd}/C_{Ni}$, for all measurement points in the coating layer described above. By including the coating layer that satisfies the condition (2) in addition to the conditions (1) and (3), the wire of the present invention can reduce a galvanic corrosion in a high-temperature environment to achieve a favorable bond reliability of the 2nd bonding part and can achieve a favorable FAB shape, and thus a favorable bonded ball shape of the 1st bonding part.

Regarding the condition (2), the average value X is, from the viewpoint of achieving a favorable bond reliability of the 2nd bonding part, 35.0 or less, preferably 34.0 or less, more preferably 32.0 or less, 30.0 or less, 28.0 or less, 26.0 or less, 25.0 or less, 24.0 or less, 22.0 or less, or 20.0 or less. When the average value of the ratio $C_{Pd}/C_{Ni}$ is more than 35.0, the galvanic corrosion cannot be reduced in a high-temperature environment, thereby often making it less likely to achieve a sufficient high-temperature bond reliability of the 2nd bonding part. Furthermore, the lower limit of the average value X is, from the viewpoint of enhancing the initial bonding strength of the 2nd bonding part and achieving a favorable initial bondability of the 2nd bonding part, 0.1 or more, preferably 0.2 or more, 0.4 or more, 0.5 or more, 0.6 or more, 0.8 or more, 1.0 or more, or more than 1.0, more preferably 1.5 or more, 2.0 or more, 2.5 or more, or 3.0 or more. When the average value X is less than 0.1, it is often less likely to achieve the initial bondability of the 2nd bonding part.

—Condition (3)—

The condition (3) relates to the total number of measurement points in the coating layer whose absolute deviation from the average value X descried above is 0.3X or less being 50% or more relative to the total number of measurement points in the coating layer. By including the coating layer that satisfies the condition (3) in combination with the conditions (1) and (2), the wire of the present invention can reduce a galvanic corrosion in a high-temperature environment to achieve a favorable bond reliability of the 2nd bonding part and can achieve a favorable FAB shape, and thus a favorable bonded ball shape of the 1st bonding part.

The condition (3), together with the condition (2), indicates that the coating layer contains the Pd—Ni alloy, which contains Pd and Ni at a predetermined ratio, in a high concentration while reducing variations in a Pd/Ni ratio in the thickness direction of the coating layer. From the viewpoint of achieving a more favorable bond reliability of the 2nd bonding part in a high-temperature environment and achieving a more favorable FAB shape, it is more preferable that the total number of measurement points in the coating layer whose absolute deviation from the average value X is 0.2X or less (more preferably 0.18X or less, 0.16X or less, or 0.15X or less) is 50% or more relative to the total number of measurement points in the coating layer.

From the viewpoint of achieving a further favorable bond reliability of the 2nd bonding part in a high-temperature environment and achieving a further favorable FAB shape, the total number of measurement points in the coating layer whose absolute deviation from the average value X falls within a predetermined range (the preferred range is as described above) is preferably 55% or more or 60% or more, more preferably 65% or more, 70% or more, or 75% or more, further preferably 80% or more, relative to the total number of measurement points in the coating layer.

In the concentration profile in the depth direction of the wire, when linearly approximating the Pd concentration $C_{Pd}$ (atomic %) or the Ni concentration $C_{Ni}$ (atomic %) by the method of least squares for all measurement points in the coating layer, the difference between the maximum value and the minimum value of the obtained approximate straight line in the depth (thickness) range of the coating layer is preferably 20 atomic % or less, more preferably 15 atomic % or less, further preferably 10 atomic % or less, 8 atomic % or less, 6 atomic % or less, or 5 atomic % or less, from the viewpoint of further obtaining the advantageous effects of the present invention. Specifically, in a case where the average value X is less than 1, it is preferable that, when linearly approximating $C_{Ni}$ (atomic %) by the method of least squares for all measurement points in the coating layer, the difference between the maximum value and the minimum value of the obtained approximate straight line in the depth range of the coating layer falls within the range described above. In a case where the average value X is 1 or more, it is preferable that, when linearly approximating $C_{Pd}$ (atomic %) by the method of least squares for all measurement points in the coating layer, the difference between the maximum value and the minimum value of the obtained approximate straight line in the depth range of the coating layer falls within the range described above.

The thickness of the coating layer in the condition (1), the average value X and the absolute deviation from the average value X, the total number of the measurement points whose absolute deviation falls within the predetermined range, and the proportion of the total number of measurement points whose absolute deviation falls within the predetermined range to the total number of measurement points in the coating layer in the conditions (2) and (3) can be confirmed and determined by performing a composition analysis using AES while digging down the wire from its surface in the depth direction (direction towards the center of the wire) by Ar sputtering. Specifically, the change in concentration of each element in the direction from the surface of the wire toward the depth (center) of the wire (so-called a concentration profile in the depth direction) is obtained by performing 1) a composition analysis of the wire surface, and then repeating 2) a sputtering treatment with Ar and 3) a surface composition analysis after the sputtering treatment, and the above factors can be confirmed and determined on the basis of the concentration profile. In the present invention, for obtaining the concentration profile in the depth direction, the unit of depth was in terms of $SiO_2$.

Figure 3:
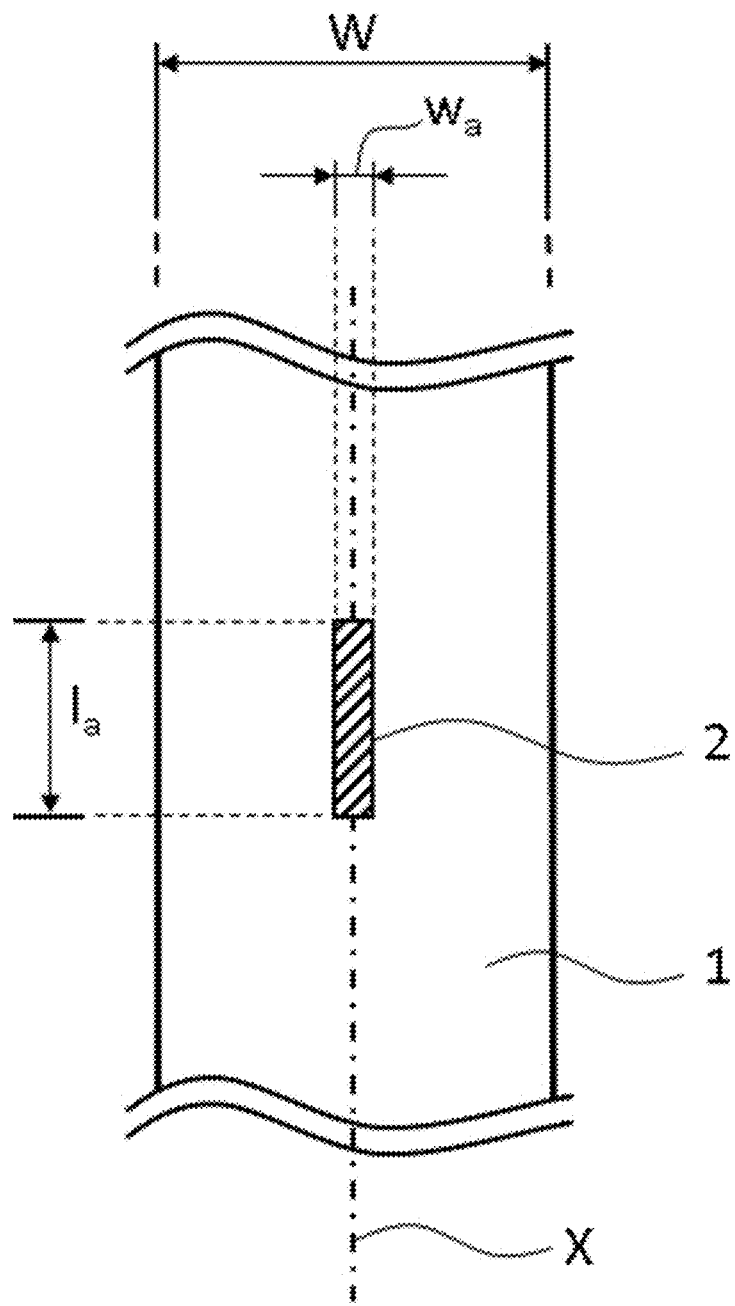
FIG. 3 is a schematic view illustrating a position and dimensions of a measuring surface for performing a composition analysis using AES.

When performing 1) the composition analysis of the wire surface and 3) the surface composition analysis after the sputtering treatment, the position and dimensions of a measuring surface are determined as follows. In the following description, the width of the measuring surface indicates the dimension of the measuring surface in a direction perpendicular to a wire axis (a thickness direction of the wire), and the length of the measuring surface indicates the dimension of the measuring surface in a direction along the wire axis (a length direction of the wire). A further description will be provided with reference to FIG. 3. FIG. 3 is a schematic plan view illustrating a wire 1 in which the direction of the wire axis (the length direction of the wire) corresponds to the vertical direction (up-down direction) of FIG. 3 and the direction perpendicular to the wire axis (the thickness direction of the wire) corresponds to the horizontal direction (left-right direction) of FIG. 3. FIG. 3 shows a measuring surface 2 in relation to the wire 1. The width of the measuring surface 2 is represented by a dimension $w_a$ of the measuring surface in the direction perpendicular to the wire axis, and the length of measuring surface 2 is represented by a dimension $l_a$ of the measuring surface in the direction of the wire axis.

The measuring surface is determined so that a center of width of the measuring surface is aligned with a center of width of the wire in the direction perpendicular to the wire axis, and the width of the measuring surface is 5% or more and 15% or less of a diameter of the wire. The length of the measuring surface is set to be five times the width of the measuring surface. In FIG. 3, the width of the wire is indicated by a symbol W, and the center of the width of the wire is indicated by a dashed line X. Thus, the measuring surface 2 is determined so that the center of width of the measuring surface 2 is aligned with the dashed line X indicating the center of width of the wire, and the width $w_a$ of the measuring surface is 5% or more and 15% or less of the diameter of the wire (the same value as the width W of the wire), that is, 0.05 W or more and 0.15 W or less. Further, the length $l_a$ of the measuring surface satisfies the relation of $l_a=5w_a$. By determining the position and dimensions of the measuring surface as described above, it is possible to measure success or failure of the conditions (1) to (3), which are required for achieving a favorable FAB shape as well as achieving a favorable bond reliability of the 2nd bonding part in a high-temperature environment, with high accuracy. Further, it is preferable to perform the measurement for measuring surfaces at a plurality of points (n≥3) which are separated from each other by 1 mm or more in the direction of the wire axis, and employ an arithmetic average value thereof.

The thickness of the coating layer in the above-mentioned condition (1), the average value X and the absolute deviation from the average value X, the total number of measurement points whose absolute deviation falls within the predetermined range, and the proportion of the total number of measurement points whose absolute deviation falls within the predetermined range relative to the total number of measurement points in the coating layer in the above-mentioned conditions (2) and (3) are based on results of measurement under the conditions described in [Thickness analysis of coating layer using Auger electron spectroscopy (AES)] described later.

There will be described a tendency of the concentration profile in the depth direction obtained for the wire of the present invention according to an embodiment. Up to a certain depth position from the surface of the wire, Pd and Ni tend to coexist at a certain ratio in a high concentration. That is, there is a region (coating layer) where the total concentration of Pd and Ni is 90 atomic % or more and, in such a region, there tends to be a certain number of measurement points whose absolute deviation from the average value X is 0.3X or less where X is defined as an average value of the ratio of the Pd concentration $C_{Pd}$ (atomic %) to the Ni concentration $C_{Ni}$ (atomic %), $C_{Pd}/C_{Ni}$, for all measurement points in the coating layer. Further proceeding in the depth direction, the concentration of Pd and Ni tends to be decreased and the concentration of Cu tends to be increased. By focusing on the Pd concentration $C_{Pd}$ (atomic %) and the Ni concentration $C_{Ni}$ (atomic %) in such a concentration profile in the depth direction, it is possible to obtain the thickness and the total number of measurement points of the coating layer based on the thickness and the total number of measurement points of the region where the total concentration of Pd and Ni is 90 atomic % or more. Further, the average value X can be obtained by arithmetically averaging the ratio $C_{Pd}/C_{Ni}$ for all measurement points in the coating layer, and the total number of measurement points whose absolute deviation from the average value X is 0.3X or less can be obtained by confirming the absolute deviation of the ratio $C_{Pd}/C_{Ni}$ from the average value X for all measurement points in the coating layer. In a case where the wire contains Au at a surface thereof as described below, the concentration of Au tends to be decreased and the concentration of Pd and Ni tends to be increased from the surface of the wire to a very shallow position in the concentration profile in the depth direction. In such a case as well, by focusing on the Pd concentration $C_{Pd}$ (atomic %) and the Ni concentration $C_{Ni}$ (atomic %), the thickness and the total number of measurement points of the coating layer can be obtained from the thickness and the total number of measurement points of the region where the total concentration of Pd and Ni is 90 atomic % or more. The average value X can be obtained by arithmetically averaging the ratio $C_{Pd}/C_{Ni}$ for all measurement points in the coating layer, and the total number of measurement points whose absolute deviation from the average value X is 0.3X or less can be obtained by confirming the absolute deviation of the ratio $C_{Pd}/C_{Ni}$ from the average value X for all measurement points in the coating layer.

—Other Preferable Conditions for Coating Layer—

In the wire of the present invention, it is more preferable that the coating layer satisfies, in addition to all of the conditions (1) to (3) described above, one or both of the following conditions (4) and (5) based on the concentration profile in the depth direction of the wire.

(4) When defining the average value of the Pd concentration $C_{Pd}$ (atomic %) for all measurement points in the coating layer as $X_{Pd}$, the total number of measurement points in the coating layer whose absolute deviation from the average value $X_{Pd}$ is $0.1X_{Pd}$ or less is 50% or more relative to the total number of measurement points in the coating layer.

(5) When defining the average value of the Ni concentration $C_{Ni}$ (atomic %) for all measurement points in the coating layer as $X_{Ni}$, the total number of measurement points in the coating layer whose absolute deviation from the average value $X_{Ni}$ is $0.1X_{Ni}$ or less is 50% or more relative to the total number of measurement points in the coating layer.

Note that, in the conditions (4) and (5), the coating layer, the thickness thereof, and the total number of measurement points in the coating layer are as described above in relation to the conditions (1) to (3). If the wire of the present invention includes the coating layer that satisfies one or both of the conditions (4) and (5) in addition to the conditions (1) to (3), it can achieve a particularly favorable bond reliability of the 2nd bonding part in a high-temperature environment and achieve a particularly favorable FAB shape.

The coating layer may contain one or more dopants selected from the second additive element, the third additive element, the fourth additive element and the fifth additive element described later, for example. Preferable contents of these dopants are described later.

The wire of the present invention may further contain Au at the surface thereof. By further containing Au at the surface of the wire, the initial bondability of the 2nd bonding part can be further improved. If the wire of the present invention further contains Au at its surface, the concentration of Au relative to the entire wire may be usually 0.5% by mass or less, preferably 0.3% by mass or less or 0.2% by mass or less. The lower limit thereof may be, for example, 0.05% by mass or more, 0.1% by mass or more, or the like. Thus, in an embodiment, the wire of the present invention satisfies the following condition (B):

(B) the bonding wire contains Au at a surface of the wire, and the concentration of Au relative to the entire wire is 0.5% by mass or less.

Note that, in a case where the wire of the present invention further contains Au at its surface, the concentration of Au as the first additive element used for determining whether or not the wire of the present invention satisfies the condition (A) described above is the concentration of Au in the core material part that is obtained by exposing the cross-section of the wire and subjecting the resulting Cu core material part to the measurement using the electron probe micro analyzer (EPMA) or the secondary-ion mass spectrometry (SIMS). That is, in a case where the wire of the present invention further contains Au at its surface, "the total concentration of the first additive element relative to the entire wire" in the condition (A) described above should be read as "the total concentration of the first additive element relative to the entire wire (provided that, the concentration of Au is the concentration thereof in the core material part)".

In an embodiment, the wire of the present invention includes the coating layer satisfying the conditions (1) to (3) described above and also satisfies the following conditions (A) and (B):

(A) the bonding wire contains one or more elements selected from the group consisting of Ti, V, Cr, Mn, Fe, Co, Zn, Zr, Nb, Mo, Ru, Rh, Sn, Ta, W, Os, Ir, Pt, Au and Bi (the first additive element), and the total concentration of the first additive element relative to the entire wire (provided that, the concentration of Au is the concentration thereof in the core material part) is 5 ppm by mass or more and 450 ppm by mass or less; and (B) the bonding wire contains Au at the surface of the wire, and the concentration of Au relative to the entire wire is 0.5% by mass or less.

The alloy-coated Cu bonding wire of the present invention including the first additive element at the specific concentration described above can improve the adhesion at the 2nd bonding part and achieve a favorable initial bondability of the 2nd bonding part, even if the Au concentration at the surface of the wire is as low as, for example, less than 10 atomic %, 8 atomic % or less, 6 atomic % or less, 5 atomic % or less, 4 atomic % or less, 2 atomic % or less, or the like.

The composition analysis of the wire surface can be performed under the same conditions as in 1) the composition analysis of the wire surface described in relation to the method of obtaining the concentration profile in the depth direction. Specifically, when performing the composition analysis of the wire surface using Auger electron spectroscopy (AES), the position and dimensions of the measuring surface are determined as follows.

The measuring surface is determined so that a center of width of the measuring surface is aligned with a center of width of the wire in the direction perpendicular to the wire axis, and the width of the measuring surface is 5% or more and 15% or less of a diameter of the wire. The length of the measuring surface is set to be five times the width of the measuring surface. By determining the position and dimensions of the measuring surface as described above, it is possible to measure the concentration of Au at the surface of the wire, which is favorable for further improving the initial bondability of the 2nd bonding part, with high accuracy. It is preferable to perform the measurement for measuring surfaces at a plurality of points (n≥3) which are separated from each other by 1 mm or more in the direction of the wire axis, and employ an arithmetic average value thereof.

The concentration of Au at the surface described above is based on a result of measurement under the conditions described in [Composition analysis of wire surface using Auger electron spectroscopy (AES)] described later.

In the wire of the present invention, a boundary between the Cu core material and the coating layer is determined based on the total concentration of Pd and Ni in the concentration profile in the depth direction of the wire. The position at which the total concentration of Pd and Ni is 90 atomic % is determined as the boundary, and then a region where the total concentration of Pd and Ni is less than 90 atomic % is determined to be the Cu core material and a region where the total concentration of Pd and Ni is 90 atomic % or more is determined to be the coating layer. In the present invention, the boundary between the Cu core material and the coating layer is not necessarily a crystal grain boundary. The thickness of the coating layer can be determined, by confirming the concentration profile from the wire surface toward the center of the wire, as a distance from a depth position Z1 where the total concentration of Pd and Ni reaches 90 atomic % for the first time to a depth position Z2 where the total concentration of Pd and Ni decreases below 90 atomic % for the first time (Z2>Z1).

The wire of the present invention is characterized by including the coating layer that satisfies the conditions (1) to (3) described above. The average value X and the absolute deviation from the average value X, the total number of measurement points whose absolute deviation falls within the predetermined range, and the proportion of the total number of measurement points whose absolute deviation falls within the predetermined range relative to the total number of measurement points in the coating layer for the conditions (2) and (3) are determined by focusing on the Pd concentration $C_{Pd}$ (atomic %) and the Ni concentration $C_{Ni}$ (atomic %) in the coating layer determined by the boundary determination method described above.

In an embodiment, the coating layer consists of: Pd and Ni; and inevitable impurities. In another embodiment, the coating layer consists of: Pd and Ni; one or more elements selected from Au and the first additive element; and inevitable impurities. In yet another embodiment, the coating layer consists of: Pd and Ni; one or more elements selected from the second additive element, the third additive element, the fourth additive element, and the fifth additive element, described below; and inevitable impurities. In yet another embodiment, the coating layer consists of: Pd and Ni; one or more selected from Au and the first additive element; one or more elements selected from the second additive element, the third additive element, the fourth additive element, and the fifth additive element, described below; and inevitable impurities. Note that the coating layer may contain the element constituting the Cu core material described above.

The wire of the present invention is characterized by satisfying the following condition (A):

(A) the wire contains one or more elements ("first additive element") selected from the group consisting of Ti, V, Cr, Mn, Fe, Co, Zn, Zr, Nb, Mo, Ru, Rh, Sn, Ta, W, Os, Ir, Pt, Au and Bi, and the total concentration of the first additive element relative to the entire wire is 5 ppm by mass or more and 450 ppm by mass or less.

The wire of the present invention including the coating layer that satisfies all of the conditions (1) to (3) described above and also satisfies the condition regarding the first additive element described above can achieve a favorable FAB shape and a favorable bond reliability of the 2nd bonding part in a high temperature environment, and also improve the adhesion at the 2nd bonding part to achieve a favorable initial bondability of the 2nd bonding part.

The condition (A) is related to the total concentration of one or more elements selected from the group consisting of Ti, V, Cr, Mn, Fe, Co, Zn, Zr, Nb, Mo, Ru, Rh, Sn, Ta, W, Os, Ir, Pt, Au and Bi, that is, the first additive element, relative to the entire wire. As described above, in a case where the wire of the present invention further contains Au at its surface, "the total concentration of the first additive element relative to the entire wire" in the condition (A) described above should be read as "the total concentration of the first additive element relative to the entire wire (provided that, the concentration of Au is the concentration thereof in the core material part)".

Regarding the condition (A), from the viewpoint of achieving the alloy-coated Cu bonding wire that improves the adhesion at the 2nd bonding part and exhibits a favorable initial bondability of the 2nd bonding part, the total concentration of the first additive element relative to the entire wire is 5 ppm by mass or more, preferably 10 ppm by mass or more, 15 ppm by mass or more, 20 ppm by mass or more, or 25 ppm by mass or more, more preferably 30 ppm by mass or more, 40 ppm by mass or more, 50 ppm by mass or more, 60 ppm by mass or more, or 80 ppm by mass or more, still more preferably 100 ppm by mass or more, 110 ppm by mass or more, 120 ppm by mass or more, 130 ppm by mass or more, 140 ppm by mass or more or 150 ppm by mass or more. In particular, it is preferable that the total concentration of the first additive element relative to the entire wire is 100 ppm by mass or more because there can be readily provided the bonding wire that improves the adhesion at the 2nd bonding part and exhibits a more favorable initial bondability of the 2nd bonding part.

Regarding the condition (A), from the viewpoint of achieving the alloy-coated Cu bonding wire that improves the adhesion at the 2nd bonding part and exhibits a favorable initial bondability of the 2nd bonding part, the total concentration of the first additive element relative to the entire wire is 450 ppm by mass or less. The upper limit of the total concentration of the first additive element may be 440 ppm by mass or less, 420 ppm by mass or less, 400 ppm by mass or less, or the like. Note that when the bonding wire contains one or more elements selected from the group consisting of Ti, V, Cr, Mn, Fe, Co and Zn (hereinafter also referred to as "1a additive element") as the first additive element, the upper limit of the total concentration of the 1a additive element may be 200 ppm by mass or less, 180 ppm by mass or less, 160 ppm by mass or less, 150 ppm by mass or less, or the like. When the bonding wire contains one or more elements selected from the group consisting of Zr, Nb, Mo, Ru, Rh and Sn (hereinafter also referred to as "1b additive element") as first additive element, the upper limit of the total concentration of the 1b additive element may be 350 ppm by mass or less, 340 ppm by mass or less, 320 ppm by mass or less, 300 ppm by mass or less, or the like.

In the wire of the present invention, from the viewpoint of achieving the bonding wire that improves the adhesion at the 2nd bonding part and exhibits a more favorable initial bondability of the 2nd bonding part, the first additive element is preferably contained in the Cu core material.

The wire of the present invention may further contain one or more elements selected from the group consisting of B, P and Mg ("second additive element"). When the wire of the present invention contains the second additive element, the total concentration of the second additive element relative to the entire wire is preferably 1 ppm by mass or more. This makes it possible to provide the bonding wire that achieves a more favorable bonded ball shape of the 1st bonding part. The total concentration of the second additive element relative to the entire wire is more preferably 2 ppm by mass or more, still more preferably 3 ppm by mass or more, 5 ppm by mass or more, 8 ppm by mass or more, 10 ppm by mass or more, 15 ppm by mass or more or 20 ppm by mass or more. From the viewpoint of suppressing hardening of the wire and reducing chip damage at the time of 1st bonding, the total concentration of the second additive element is preferably 100 ppm by mass or less, more preferably 90 ppm by mass or less, 80 ppm by mass or less, 70 ppm by mass or less, 60 ppm by mass or less or 50 ppm by mass or less. Accordingly, in a preferable embodiment, the wire of the present invention contains the second additive element, and the total concentration of the second additive element is 1 ppm by mass or more and 100 ppm by mass or less relative to the entire wire.

When the wire of the present invention contains the second additive element, the second additive element may be contained in either one of the Cu core material or the coating layer, or may be contained in both of them. From the viewpoint of providing the bonding wire that achieves a more favorable bonded ball shape of the 1st bonding part, the second additive element is preferably contained in the Cu core material.

The wire of the present invention may further contain one or more elements selected from the group consisting of Se, Te, As and Sb ("third additive element"). When the wire of the present invention contains the third additive element, the total concentration of the third additive element relative to the entire wire is preferably 1 ppm by mass or more. This makes it possible to improve the bond reliability of the 1st bonding part in a high-temperature and high-humidity environment. The total concentration of the third additive element relative to the entire wire is more preferably 2 ppm by mass or more, still more preferably 3 ppm by mass or more, 5 ppm by mass or more, 8 ppm by mass or more, 10 ppm by mass or more, 15 ppm by mass or more, or 20 ppm by mass or more. From the viewpoint of achieving a favorable FAB shape and achieving a favorable bonded ball shape of the 1st bonding part, the total concentration of the third additive element is preferably 100 ppm by mass or less, more preferably 90 ppm by mass or less, 80 ppm by mass or less, 70 ppm by mass or less, 60 ppm by mass or less, or 50 ppm by mass or less. Thus, in a preferable embodiment, the wire of the present invention contains the third additive element, and the total concentration of the third additive element is 1 ppm by mass or more and 100 ppm by mass or less relative to the entire wire.

When the wire of the present invention contains the third additive element, the third additive element may be contained in either one of the Cu core material or the coating layer, or may be contained in both of them. From the viewpoint of providing the bonding wire that achieves a further favorable bond reliability of the 1st bonding part in a high-temperature and high-humidity environment, the third additive element is preferably contained in the coating layer.

The wire of the present invention may further contain one or more elements selected from the group consisting of Ga and Ge ("fourth additive element"). When the wire of the present invention contains the fourth additive element, the total concentration of the fourth additive element relative to the entire wire is preferably 0.011% by mass or more. This makes it possible to improve the bond reliability of the 1st bonding part in a high-temperature environment. The total concentration of the fourth additive element relative to the entire wire is more preferably 0.015% by mass or more, and more preferably 0.02% by mass or more, 0.025% by mass or more, 0.03% by mass or more, 0.031% by mass or more, 0.035% by mass or more, 0.04% by mass or more, 0.05% by mass or more, 0.07% by mass or more, 0.09% by mass or more, 0.1% by mass or more, 0.12% by mass or more, 0.14% by mass or more, 0.15% by mass or more, or 0.2% by mass or more. From the viewpoint of achieving a favorable FAB shape, a favorable bonded ball shape of the 1st bonding part, and a favorable initial bondability of the 2nd bonding part, the total concentration of the fourth additive element is preferably 1.5% by mass or less, and more preferably 1.4% by mass or less, 1.3% by mass or less, or 1.2% by mass or less. Accordingly, in a preferable embodiment, the wire of the present invention contains the fourth additive element, and the total concentration of the fourth additive element is 0.011% by mass or more and 1.5% by mass or less relative to the entire wire.

When the wire of the present invention contains the fourth additive element, the fourth additive element may be contained in either one of the Cu core material or the coating layer, or may be contained in both of them.

The wire of the present invention may further contain one or more elements selected from the group consisting of In and Ag ("fifth additive element"). When the wire of the present invention contains the fifth additive element, the total concentration of the fifth additive element relative to the entire wire is preferably 1 ppm by mass or more. This makes it possible to achieve a favorable bond reliability of the 2nd bonding part in a more rigorous high-temperature environment (for example, 200° C.). The total concentration of the fifth additive element relative to the entire wire is preferably 2 ppm by mass or more, 3 ppm by mass or more, 4 ppm by mass or more or 5 ppm by mass or more, more preferably 6 ppm by mass or more, 8 ppm by mass or more or 10 ppm by mass or more, still more preferably 20 ppm by mass or more, 30 ppm by mass or more or 40 ppm by mass or more, yet still more preferably 50 ppm by mass or more, 60 ppm by mass or more or 70 ppm by mass or more. The upper limit of the concentration of the fifth additive element relative to the entire wire can be, for example, 500 ppm by mass or less, 480 ppm by mass or less, 460 ppm by mass or less, 450 ppm by mass or less, or the like in consideration of costs and the like because the effect of improving the bond reliability of the 2nd bonding part in a high-temperature environment is not further increased even when the content exceeds this limit. Thus, in a preferable embodiment, the wire of the present invention contains the fifth additive element, and the total concentration of the fifth additive element is 1 ppm by mass or more and 500 ppm by mass or less relative to the entire wire.

When the wire of the present invention contains the fifth additive element, the fifth additive element may be contained in either one of the Cu core material or the coating layer, or may be contained in both of them. From the viewpoint of providing the bonding wire that achieves a favorable bond reliability of the 2nd bonding part in a rigorous high-temperature environment, the fifth additive element is preferably contained in the Cu core material.

The contents of the first additive element, the second additive element, the third additive element, the fourth additive element and the fifth additive element in the wire can be measured by the method described in [Measurement of element content] described later.

In the wire of the present invention, the total concentration of Cu, Ni and Pd may be, for example, 98.5% by mass or more, 98.6% by mass or more, 98.7% by mass or more, 98.8% by mass or more, or the like.

The diameter of the wire of the present invention is not particularly limited and may be determined as appropriate depending on the specific purpose. Preferably, the diameter of the wire may be 13 µm or more, 15 µm or more, 18 µm or more, 20 µm or more, or the like. The upper limit of the diameter is not particularly limited, and may be, for example, 80 µm or less, 70 µm or less, 50 µm or less, or the like.

The wire of the present invention can achieve a favorable FAB shape and also a favorable initial bondability of the 2nd bonding part including the adhesion at the 2nd bonding part, and can reduce the galvanic corrosion in a high-temperature environment to achieve a favorable bond reliability of the 2nd bonding part. Thus, the bonding wire of the present invention can be suitably used for connecting the electrode on the semiconductor chip and the external terminal such as the lead frame or the electrode on the substrate.

<Manufacturing Method of Wire>

There will be described an example of a method for manufacturing the bonding wire according to the present invention.

First, raw material copper of purity 4N (99.99% by mass or more) or higher is used to obtain an ingot containing respective dopants by a method described below.

In a case of adding a dopant such as the first additive element and if needed, the second additive element, the third additive element, the fourth additive element and the fifth additive element, examples of an addition method therefor may include a method of causing the dopant to be contained in the Cu core material, a method of causing the dopant to be contained in the coating layer, a method of depositing the dopant on the surface of the Cu core material, and a method of depositing the dopant on the surface of the coating layer. These methods may be combined with each other and may be selected as appropriate. In the method of causing the dopant to be contained in the Cu core material, a dopant component may be directly added to Cu, or a mother alloy containing about several percents of a dopant component may be used. In the method of causing the dopant to be contained in the coating layer, the dopant may be contained in Pd, Ni plating bath at the time of forming the coating layer (in a case of wet plating), or in a target material (in a case of dry plating). In the method of depositing the dopant on the surface of the Cu core material and the method of depositing the dopant on the surface of the coating layer, at least one type of deposition treatment selected from (1) application of aqueous solution→drying→heat treatment, (2) a plating method (wet), and (3) a vapor deposition method (dry) may be performed while the surface of the Cu core material or the surface of the coating layer being as a deposition surface.

The above-mentioned ingot is subjected to forging, rolling, and wire-drawing to produce a wire of Cu or Cu alloy with a diameter of about 0.7 to 2.0 mm (hereinafter also referred to as an "intermediate wire").

As a method for forming the coating layer on the surface of the Cu core material, an electroplating, an electroless plating, a vapor deposition, and the like can be used. Among these, the electroplating is preferable industrially because it can stably control film thickness. For example, the coating layer may be formed on the surface of the intermediate wire. The coating layer may be deposited at a stage of the ingot, or the coating layer may be formed on the surface of the Cu core material after further thinning the intermediate wire by performing the wire-drawing (for example, after carrying out the wire-drawing to a final diameter). The coating layer may be formed by, for example, providing a Pd—Ni alloy layer containing Pd and Ni at a predetermined ratio on the surface of the Cu core material. Alternatively, from the viewpoint of forming the coating layer with an excellent adhesiveness to the Cu core material, the coating layer may be formed by performing a strike plating with conductive metal on the surface of the Cu core material and then providing the Pd—Ni alloy layer containing Pd and Ni at the predetermined ratio thereon. Further, after forming the Pd—Ni alloy layer containing Pd and Ni at the predetermined ratio, a layer containing at least one of Pd and Ni (e.g., a Pd layer, an Ni layer, or a Pd—Ni alloy layer) may be further provided.

In a case of forming the wire containing Au at the surface thereof, the wire can be formed by providing an Au layer on the surface of the coating layer by the same method as described above.

In the wire-drawing process, the wire is drawn to the final wire diameter (approximately 13 to 80 μm in diameter) using a wire-drawing machine with diamond dies. Furthermore, as the heat treatment, in addition to the refining heat treatment performed at the final wire diameter, the intermediate heat treatment may be performed at the intermediate stage of the wire-drawing process.

[Semiconductor Device]

The semiconductor device can be manufactured by connecting an electrode on a semiconductor chip to an external terminal such as a lead frame or an electrode on a circuit board by using the bonding wire for semiconductor devices of the present invention.

In an embodiment, the semiconductor device according to the present invention includes a circuit board, a semiconductor chip, and a bonding wire for electrically connecting the circuit board and the semiconductor chip with each other, and is characterized in that the bonding wire is the wire of the present invention.

In the semiconductor device according to the present invention, the circuit board and the semiconductor chip are not particularly limited, and a known circuit board and semiconductor chip that may be used for constituting the semiconductor device may be used. Alternatively, a lead frame may be used in place of the circuit board. For example, like the semiconductor device disclosed in JP 2020-150116 A, the semiconductor device may include a lead frame and a semiconductor chip mounted on the lead frame.

Examples of the semiconductor device may include various semiconductor devices used for electric products (for example, a computer, a cellular telephone, a digital camera, a television set, an air conditioner, a solar power generation system, and the like), vehicles (for example, a motorcycle, an automobile, an electric train, a ship, and an aircraft), and the like.

Examples

There will be specifically described the present invention with Examples. However, the present invention is not limited to the Examples described below.

Sample

First, the method of preparing a sample will be described. For Cu as a raw material, Cu having a purity of 4N (99.99% by mass or more) or higher was used. Furthermore, for the first additive element, and if added, the second additive element, the third additive element, the fourth additive element and the fifth additive element, the additive elements having a purity of 3N or higher were used. Alternatively, a mother alloy of Cu including several percents of these additive elements was used.

For the Cu alloy as the core material, the raw material was first charged into a graphite crucible and melted by heating to 1090 to 1800° C. in an inert atmosphere such as an $N_2$ gas or Ar gas using a high-frequency furnace. Then, an ingot with a diameter of 3 to 6 mm was manufactured by continuous casting. Next, the ingot thus obtained was subjected to the wire-drawing process to produce an intermediate wire with a diameter of 0.7 to 2.0 mm. In the wire-drawing process, a commercially available lubricant was used, and the wire-drawing speed was set to 20 to 150 m/min. An electroplating method was used for forming the coating layer. In some wires (Example Nos. 5, 9, 15, 27, 33 and 36), an Au layer was provided on the Pd—Ni alloy layer. As the plating liquid, a Pd—Ni plating liquid and an Au plating liquid were prepared and used after appropriately adjusted. Thereafter, the wire was further subjected to wire-drawing processing and the like to be processed to have a final wire diameter of φ20 μm. During the wire-drawing processing, an intermediate heat treatment was performed 1 to 2 times at 300 to 700° C. for 2 to 15 seconds as needed. The intermediate heat treatment was performed while continuously feeding the wire under flowing of an $N_2$ gas or Ar gas. After the wire was processed to have the final wire diameter, a refining heat treatment was performed while continuously feeding the wire under flowing of an $N_2$ gas or Ar gas. The heat treatment temperature for the refining heat treatment was 200 to 600° C., the wire feeding speed was 20 to 200 m/min, and the heat treatment time was 0.2 to 1.0 seconds. If the coating layer was thin, the heat treatment temperature was set to be lower and the wire feeding speed was set to be higher. If the coating layer was thick, the heat treatment temperature was set to be higher and the wire feeding speed was set to be lower.

(Test and Evaluation Methods)

There will be described test and evaluation methods.

[Composition Analysis of Wire Surface Using Auger Electron Spectroscopy (AES)]

Regarding the wire containing Au at the surface of the wire, the concentration of Au at the surface of the wire was determined by performing a measurement using the Auger electron spectroscopy (AES) where the measuring surface was a surface of the wire as follows.

First, the bonding wire to be measured was fixed to a sample holder in a linear arrangement. Next, the measuring surface was determined so that the center of width of the measuring surface was aligned with the center of width of the wire in the direction perpendicular to the wire axis, and the width of the measuring surface was 5% or more and 15% or less of the diameter of the wire. The length of the measuring surface was set to be five times the width of the measuring surface. With using an AES device (PHI-700 manufactured by ULVAC-PHI, INC.), the composition analysis was performed on the surface of the wire under a condition of acceleration voltage of 10 kV to obtain a surface Au concentration (atomic %).

The composition analysis using the AES was performed on the measuring surfaces at three points which were separated from each other by 1 mm or more in the direction of the wire axis, and an arithmetic average value thereof was employed. When determining the concentration of Au at the surface, a gas component such as carbon (C), sulfur(S), oxygen (O), or nitrogen (N), a nonmetallic element, and the like were not considered.

[Thickness Analysis of Coating Layer Using Auger Electron Spectroscopy (AES)]

A depth analysis using AES was used for the thickness analysis of the coating layer. The depth analysis using AES analyzes a change in a composition in the depth direction by alternately performing a composition analysis and sputtering, and as a result, a change in concentration of each element in the depth direction (toward center) from the surface of the wire (so-called a concentration profile in the depth direction) can be obtained.

Specifically, the concentration profile in the depth direction was obtained with AES by performing 1) a composition analysis of the wire surface, and then repeating 2) a sputtering treatment with Ar and 3) a surface composition analysis after the sputtering treatment. The sputtering treatment in 2) was performed at an acceleration voltage of 2 kV with Ar+ ion. In the surface composition analysis in 1) and 3), the dimensions of the measuring surface and the conditions for the composition analysis using AES and for calculating concentrations of respective elements were the same as those described in [Composition analysis of wire surface using Auger electron spectroscopy (AES)] described above. For obtaining the concentration profile in the depth direction using AES, the measurement was performed so that the number of measurement points in the depth direction is 50 or more for the coating layer.

The concentration profile in the depth direction was obtained for the measuring surfaces at three points which were separated from each other by 1 mm or more in the direction of the wire axis.

—Thickness of Coating Layer and Total Number of Measurement Points in Coating Layer—

In the obtained concentration profile in the depth direction, the concentration profile was confirmed from the wire surface toward the center of the wire to obtain a distance from a depth position Z1 where the total of the Pd concentration $C_{Pd}$ (atomic %) and the Ni concentration $C_{Ni}$ (atomic %) reached 90 atomic % for the first time to a depth position Z2 where the total of $C_{Pd}$ and $C_{Ni}$ decreased below 90 atomic % for the first time (Z2>Z1) as a measured thickness of the coating layer. Further, the total number of measurement points from the depth position Z1 to the depth position Z2 was obtained as the total number of measurement points in the coating layer. The arithmetic average value of numerical values obtained for the measuring surfaces at three points was employed as the thickness of the coating layer. It was confirmed that the total number of measurement points in the coating layer was 50 to 100 for the wires of the Examples.

Note that the depth measured by the AES analysis is obtained as the product of the sputtering rate and time. Since the sputtering rate is generally measured using a reference sample $SiO_2$, the depth analyzed using AES is represented by an $SiO_2$ equivalent value. Thus, the unit for the thickness of the coating layer was in terms of $SiO_2$.

—Average Value X and Total Number of Measurement Points Whose Absolute Deviation from Average Value X Falls within Predetermined Range—

In the obtained concentration profile in the depth direction, the ratio of the Pd concentration $C_{Pd}$ (atomic %) to the Ni concentration $C_{Ni}$ (atomic %), $C_{Pd}/C_{Ni}$, for all measurement points in the coating layer was arithmetically averaged to obtain the average value X. Then, the absolute deviation from the average value X was calculated in the ratio $C_{Pd}/C_{Ni}$ for all measurement points in the coating layer, and the total number of measurement points whose absolute deviation from the average value X is 0.3X or less and the total number of measurement points whose absolute deviation from the average value X is 0.2X or less were obtained. The arithmetic average value of numerical values obtained for the measuring surfaces at three points was employed as the average value X.

—Slope of Approximate Straight Line of $C_{Pd}$ or $C_{Ni}$ (Difference Between Maximum Value and Minimum Value in Depth Range of Coating Layer)—

$C_{Pd}$ (atomic %) or $C_{Ni}$ (atomic %) was linearly approximated by the method of least squares for all measurement points in the coating layer to obtain a difference (atomic %) between the maximum value and minimum value of the obtained approximate straight line in the depth range of the coating layer. Herein, if the average value X was less than 1, $C_{Ni}$ (atomic %) was linearly approximated by the method of least squares for all measurement points in the coating layer, and if the average value X was 1 or more, $C_{Pd}$ (atomic %) was linearly approximated by the method of least squares for all measurement points in the coating layer. As the difference (atomic %) between the maximum value and the minimum value of the obtained approximate straight line in the depth range of the coating layer, the arithmetic average value of numerical values obtained for the measuring surfaces at three points was employed.

[Measurement of Element Content]

The contents of the first additive element, the second additive element, the third additive element, the fourth additive element and the fifth additive element in the wire were detected as the concentrations of elements contained in the entire wire by analyzing a liquid, which was obtained by dissolving the bonding wire with a strong acid, using an ICP optical emission spectrometer or an ICP mass spectrometer. As the analysis device, ICP-OES ("PS3520UVDDII" manufactured by Hitachi High-Tech Science Corp.) or ICP-MS ("Agilent 7700x ICP-MS" manufactured by Agilent Technologies, Inc.) was used. For a wire further containing Au at its surface, the concentration of Au as the first additive element was determined by exposing the cross-section of the wire and subjecting the Cu core material part to measurement using the electron probe micro analyzer (EPMA) or the secondary-ion mass spectrometry (SIMS).

[Fab Shape]

The evaluation of the FAB shape was performed by producing an FAB on a lead frame using a commercially available wire bonder and observing the FAB with a scanning electron microscope (SEM) (evaluation number N=100). The FAB was formed with a current value of 30 to 75 mA, an EFO gap of 762 μm, and a tail length of 254 μm while flowing an $N_2+5\%$ $H_2$ gas at a flow rate of 0.4 to 0.6 L/min. The diameter of the FAB was in the range of 1.5 to 1.9 times the wire diameter. The FAB shape was determined to be favorable if it had a true spherical shape and determined to be failure if it showed eccentricity, irregular shape, or poor melting. Evaluation was then performed in accordance with the following criteria.

Evaluation Criteria:
  ⊚: 5 or less failures
  ○: 6 to 10 failures (no problem for practical use)
  X: 11 or more failures

[Initial Bondability of 2nd Bonding Part]

The initial bondability of the 2nd bonding part was evaluated by measuring and observing the bonding strength and adhesion at the 2nd bonding part. Specifically, the bonding strength at the 2nd bonding part was measured by a pull test. Further, the adhesion at the 2nd bonding part was evaluated by observing the cross section of the 2nd bonding part using SEM.

—Bonding Strength of 2nd Bonding Part—

Using a commercially available wire bonder, 80 wires were bonded in each of up-and-down and right-and-left directions (320 wires in total) onto an Ag-plated Cu alloy lead frame, thereby preparing an evaluation sample.

Then, the pull test was performed on the 2nd bonding part. As a pull force value, the arithmetic average value of 60 measurement values in total, 15 measurement values from each direction, was used.

—Adhesion of 2nd Bonding Part—

Using the commercially available wire bonder, 40 wires were bonded in each of up-and-down and right-and-left directions (160 wires in total) onto a PPF-plated Cu alloy lead frame, thereby preparing an evaluation sample.

Then, the cross section of the 2nd bonding part was polished using an ion beam to prepare a sample for SEM observation. Specifically, the evaluation sample was cut in a direction perpendicular to the main surface of the lead frame at the position where the width of the 2nd bonding part was maximum when viewed from directly above in the direction perpendicular to the main surface of the lead frame, and the cut cross section was polished to prepare the sample for SEM observation. The width of the 2nd bonding part described herein refers to the dimension the left-right direction of the 2nd bonding part 10 in FIG. 1. The cross-sectional polishing with the ion beam was performed in a direction perpendicular to a straight line passing through the center X of the wire width in FIG. 1 (along the two-dot chain line A-A in FIG. 1) at the position where the width of the 2nd bonding part was approximately the maximum.

For the obtained SEM observation sample, the cross section of the 2nd bonding part was observed using SEM, and a proportion of the width where the wire and the lead frame adhered with each other (L2 in FIG. 2) relative to the total width of the 2nd bonding part (L1 in FIG. 2), that is, an adhesion rate (%) (=L2/L1×100), was calculated. Observations and calculations were performed for the 2nd bonding part at three locations, and the arithmetic average value thereof was used.

Based on the bonding strength (pull force) and the adhesion (adhesion rate) of the obtained 2nd bonding part, the 2nd bonding part was evaluated according to the following criteria.

Evaluation Criteria:
- ⊚⊚: adhesion rate of 90% or more and pull force of 8 gf or more
- ⊚: adhesion rate of 90% or more and pull force of 6 gf or more and less than 8 gf, or pull force of 12 gf or more and adhesion rate of 80% or more and less than 90%
- ○: adhesion rate of 80% or more and less than 90% and pull force of 6 gf or more and less than 12 gf
- X: adhesion rate of less than 80% or pull force of less than 6 gf

[Bond Reliability of 2nd Bonding Part]

The bond reliability of the 2nd bonding part was evaluated by the High Temperature Storage Life Test (HTSL).

A sample was prepared by performing wedge bonding onto leads of a lead frame using the commercially available wire bonder. The resultant sample was sealed by a commercially available thermosetting epoxy resin to prepare a sample for testing the bond reliability of the 2nd bonding part. A Cu alloy lead frame plated with 1 to 3-μm Ag was used for the lead frame. The prepared sample for bond reliability evaluation was exposed to an environment with a temperature of 175° C. using a high-temperature thermostatic device. The pull test on the wedge bonded part was performed every 500 hours, and a time until a value of pull force became half of the initial pull force was determined to be the bonding life of the 2nd bonding part. An arithmetic average value of measurement values of 50 wedge bonded parts randomly selected was used for the value of the pull force. The pull test after the High Temperature Storage Life Test was performed after removing the resin by an acid treatment, and exposing the wedge bonded part. Evaluation was then performed in accordance with the following criteria.

Evaluation Criteria:
- ⊚⊚: Bonding life of 3000 hours or more
- ⊚: Bonding life of 2000 hours or more and less than 3000 hours
- ○: Bonding life of 1000 hours or more and less than 2000 hours
- X: Bonding life of less than 1000 hours

[Bond Reliability of 1st Bonding Part]

The bond reliability of the 1st bonding part was evaluated by both of the High Temperature Storage Life Test (HTSL) and the Highly Accelerated Temperature and Humidity Stress Test (HAST).

—HTSL—

A sample was prepared by performing ball bonding on an electrode that was disposed by depositing an Al—1.0 mass % Si—0.5 mass % Cu alloy having a thickness of 1.5 μm on a silicon substrate on a general metal frame. The resultant sample was sealed by a commercially available thermosetting epoxy resin to prepare a sample for testing the bond reliability of the 1st bonding part. The ball was formed under the conditions described in the section [FAB shape] described above. The prepared sample for bond reliability evaluation was exposed to an environment with a temperature of 175° C. using a high-temperature thermostatic device. The shear test on the ball bonded part was performed every 500 hours, and a time until a value of shear force became half of the initial shear force was determined to be the bonding life of the 1st bonding part. An arithmetic average value of measurement values of 50 ball bonded parts randomly selected was used for the value of the shear force. The shear test after the High Temperature Storage Life Test was performed after removing the resin by an acid treatment, and exposing the ball bonded part. Evaluation was then performed in accordance with the following criteria.

Evaluation criteria:
- ⊚: Bonding life of 2000 hours or more
- ○: Bonding life of 1000 hours or more and less than 2000 hours
- X: Bonding life of less than 1000 hours

—HAST—

The sample for evaluating the bond reliability of the 1st bonding part prepared by the same procedure as that described above was exposed to a high-temperature and high-humidity environment with a temperature of 130° C. and a relative humidity of 85% using an unsaturated type pressure cooker tester and was biased with 7 V. The shear test on the ball bonded part was performed every 48 hours, and a time until a value of shear force became half of the initial shear force was determined to be the bonding life of the 1st bonding part. An arithmetic average value of measurement values of 50 ball bonded parts randomly selected was used for the value of the shear force. The shear test was performed after removing the resin by an acid treatment, and exposing the ball bonded part. Evaluation was then performed in accordance with the following criteria.

Evaluation Criteria:
- ⊚: Bonding life of 384 hours or more
- ○: Bonding life of 240 hours or more and less than 384 hours
- X: Bonding life of less than 240 hours

[Bonded Ball Shape]

The evaluation of the bonded ball shape of the 1st bonding part (the crushed shape of ball) was carried out by forming a ball using a commercially available wire bonder under the conditions described in the section [FAB shape] described above, compression-bonding the ball onto an electrode that had been formed by depositing an Al—1.0 mass % Si—0.5 mass % Cu alloy film having a thickness of 1.5 μm on a Si substrate, and observing the bonded part from directly above by an optical microscope (the number of evaluations N=100). In the evaluation of the crushed shape of ball, a case in which a crushed shape was close to true circle was determined to be favorable, and a case in which a crushed shape was an oval shape or a petal shape was determined to be failure. Evaluation was then performed in accordance with the following criteria.

Evaluation Criteria:
◎: 0 failure
○: 1 to 5 failures (no problem for practical use)
X: 6 or more failures The evaluation results of Examples and Comparative Examples are shown in Tables 1 and 2.

TABLE 1

| | No. | Diameter um | Thickness of coating layer nm | Average value X*1 | Measurement points with absolute deviation of 0.3X or less*2 % | Measurement points with absolute deviation of 0.2X or less*3 % | Difference between maximum value and minimum value of approximate straight line of $C_{Pd}$ or $C_{Ni}$ at % | Au concentration Surface at % | Au concentration Entire wire mass % | First additive element (Ti, V, Cr, Mn, Fe, Co, Zn, Zr, Nb, Mo, Ru, Rh, Sn, Ta, W, Os, Ir, Pt, Au, Bi) ppm by mass |
|---|---|---|---|---|---|---|---|---|---|---|
| Examples | 1 | 20 | 30 | 1.2 | 70 | 66 | 8 | | | Ti: 10 |
| | 2 | 20 | 10 | 1.8 | 60 | 60 | 18 | | | V: 10, Cr: 10 |
| | 3 | 20 | 75 | 4 | 82 | 78 | 15 | | | Mn: 30, Co: 30 |
| | 4 | 20 | 104 | 0.7 | 90 | 82 | 8 | | | Fe: 5 |
| | 5 | 20 | 130 | 5 | 92 | 86 | 7 | 15 | 0.06 | Fe: 5 |
| | 6 | 20 | 43 | 2.8 | 50 | 45 | 16 | | | Zn: 150 |
| | 7 | 20 | 100 | 0.8 | 95 | 90 | 3 | | | Zr: 5 |
| | 8 | 20 | 68 | 35 | 77 | 77 | 9 | | | Nb: 10, Mo: 30 |
| | 9 | 20 | 92 | 1.5 | 68 | 60 | 15 | 45 | 0.15 | Ru: 200 |
| | 10 | 20 | 55 | 0.2 | 60 | 50 | 21 | | | Rh: 20 |
| | 11 | 20 | 18 | 20 | 77 | 72 | 7 | | | Sn: 300 |
| | 12 | 20 | 95 | 0.6 | 92 | 92 | 4 | | | Au: 10, Ta: 10 |
| | 13 | 20 | 110 | 0.6 | 100 | 100 | 3 | | | W: 30, Bi: 45 |
| | 14 | 20 | 42 | 12 | 55 | 52 | 18 | | | Os: 100, Ir: 80 |
| | 15 | 20 | 55 | 2.2 | 78 | 70 | 12 | 65 | 0.27 | Pt: 220 |
| | 16 | 20 | 82 | 2.4 | 88 | 82 | 7 | | | Au: 450 |
| | 17 | 20 | 72 | 2.8 | 86 | 82 | 7 | | | Bi: 5 |
| | 18 | 20 | 62 | 6 | 82 | 74 | 9 | | | Ti: 10, Sn: 20 |
| | 19 | 20 | 27 | 1.2 | 56 | 48 | 22 | | | Cr: 100. Zr.200 |
| | 20 | 20 | 37 | 0.4 | 94 | 90 | 5 | | | Fe: 20. Pt: 40 |
| | 21 | 20 | 72 | 1.3 | 94 | 91 | 6 | | | V: 20, Mn: 20, Ir: 20, Au: 30 |
| | 22 | 20 | 80 | 0.1 | 88 | 86 | 10 | | | Rh: 5, Bi: 15 |
| | 23 | 20 | 12 | 0.7 | 60 | 60 | 14 | | | Sn: 150, Pt: 300 |

| | Second additive element (B, P, Mg) ppm by mass | Third additive element (Se, Te, As, Sb) ppm by mass | Fourth additive element (Ga, Ge) mass % | Fifth additive element (In, Ag) ppm by mass | FAB shape | Bond reliability of 2nd bonding part | Initial bondability of 2nd bonding part | Bond reliability of 1st bonding part HAST | Bond reliability of 1st bonding part HTSL | Crushed shape |
|---|---|---|---|---|---|---|---|---|---|---|
| Examples | | | | | ◎ | ◎ | ○ | ○ | ○ | ◎ |
| | | | | | ○ | ○ | ○ | ○ | ○ | ◎ |
| | | | | | ◎ | ◎ | ◎ | ○ | ○ | ◎ |
| | | | | | ◎ | ◎◎ | ○ | ○ | ○ | ◎ |
| | | | | | ◎ | ◎◎ | ○ | ○ | ○ | ◎ |
| | | | | | ○ | ○ | ◎◎ | ○ | ○ | ◎ |
| | | | | | ◎ | ◎◎ | ○ | ○ | ○ | ◎ |
| | | | | | ◎ | ◎ | ◎ | ○ | ○ | ◎ |
| | | | | | ◎ | ◎ | ◎◎ | ○ | ○ | ◎ |
| | | | | | ○ | ○ | ○ | ○ | ○ | ◎ |
| | | | | | ◎ | ○ | ◎◎ | ○ | ○ | ◎ |
| | | | | | ◎ | ◎◎ | ◎ | ○ | ○ | ◎ |
| | | | | | ◎ | ◎◎ | ◎ | ○ | ○ | ◎ |
| | | | | | ◎ | ○ | ◎◎ | ○ | ○ | ◎ |
| | | | | | ◎ | ○ | ◎◎ | ○ | ○ | ◎ |
| | | | | | ◎ | ◎◎ | ◎◎ | ○ | ○ | ◎ |
| | | | | | ◎ | ○ | ○ | ○ | ○ | ◎ |
| | | | | | ◎ | ◎◎ | ◎ | ○ | ○ | ◎ |
| | | | | | ◎ | ○ | ◎ | ○ | ○ | ◎ |
| | | | | | ◎ | ◎◎ | ◎◎ | ○ | ○ | ◎ |
| | | | | | ◎ | ◎◎ | ◎ | ○ | ○ | ◎ |
| | | | | | ◎ | ◎◎ | ◎ | ○ | ○ | ◎ |
| | | | | | ○ | ○ | ◎◎ | ○ | ○ | ◎ |

TABLE 1-continued

| | | | | | |
|---|---|---|---|---|---|
| ◎ | ◎ | ◎ | ○ | ○ | ◎ |
| ◎ | ◎◎ | ◎ | ○ | ○ | ◎ |
| ◎ | ○ | ○ | ○ | ○ | ◎ |
| ○ | ○ | ◎◎ | ○ | ○ | ◎ |

*[1] Average value X of ratio of Pd concentration $C_{Pd}$ (atomic %) to Ni concentration $C_{Ni}$ (atomic %), $C_{Pd}/C_{Ni}$ for all measurement points in coating layer

*[2] Proportion (%) of total number of measurement points in coating layer whose absolute deviation from average value X is 0.3X or less relative to total number of measurement points in coating layer

*[3] Proportion (%) of total number of measurement points in coating layer whose absolute deviation from average value X is 0.2X or less relative to total number of measurement points in coating layer

TABLE 2

| | No. | Diameter um | Thickness of coating layer nm | Average value X*[1] | Measurement points with absolute deviation of 0.3X or less*[2] | Measurement points with absolute deviation of 0.2X or less*[3] | Difference between maximum value and minimum value of approximate straight line of $C_{Pd}$ or $C_{Ni}$ at % | Au concentration Surface at % | Au concentration Entire wire mass % | First additive element (Ti, V, Cr, Mn, Fe, Co, Zn, Zr, Nb, Mo, Ru, Rh, Sn, Ta, W, Os, Ir, Pt, Au, Bi) ppm by mass |
|---|---|---|---|---|---|---|---|---|---|---|
| Examples | 24 | 20 | 128 | 3.3 | 95 | 90 | 4 | | | Zn: 20 |
| | 25 | 20 | 105 | 0.8 | 98 | 94 | 9 | | | Rh: 30 |
| | 26 | 50 | 18 | 1.5 | 66 | 62 | 17 | | | Pt: 200 |
| | 27 | 50 | 60 | 4 | 72 | 68 | 16 | 30 | 0.10 | Cr: 60, Bi: 30 |
| | 28 | 50 | 80 | 2 | 85 | 82 | 10 | | | Ta: 100 |
| | 29 | 50 | 110 | 0.6 | 75 | 72 | 14 | | | Zr: 15 |
| | 30 | 50 | 120 | 0.6 | 90 | 88 | 3 | | | Co: 5 |
| | 31 | 50 | 20 | 1.5 | 90 | 90 | 3 | | | Au: 10 |
| | 32 | 50 | 65 | 1.2 | 88 | 83 | 8 | | | Pt: 6 |
| | 33 | 20 | 77 | 2.8 | 87 | 81 | 8 | 72 | 0.22 | Pt: 10 |
| | 34 | 20 | 35 | 1.1 | 78 | 70 | 13 | | | Mn: 10, Nb: 10, Ir: 20 |
| | 35 | 20 | 100 | 0.7 | 74 | 68 | 11 | | | Zr: 2, Sn: 4 |
| | 36 | 20 | 65 | 2.7 | 95 | 90 | 8 | 57 | 0.15 | Bi: 50 |
| | 37 | 20 | 33 | 0.8 | 72 | 66 | 12 | | | Ti: 35 |
| | 38 | 50 | 92 | 1.8 | 88 | 84 | 8 | | | Zr: 120 |
| Comparative Examples | 1 | 20 | 68 | 1.8 | 82 | 75 | 15 | | | |
| | 2 | 20 | 48 | 0.8 | 75 | 64 | 11 | | | Ru: 4 |
| | 3 | 20 | 15 | 2.1 | 66 | 62 | 8 | | | V: 4 |
| | 4 | 20 | 8 | 0.6 | 60 | 38 | 10 | | | Ta: 500 |
| | 5 | 20 | 135 | 1.2 | 78 | 70 | 12 | | | |
| | 6 | 20 | 55 | 0.8 | 20 | 20 | 30 | | | Fe: 15 |
| | 7 | 20 | 45 | 0.03 | 83 | 68 | 4 | | | |
| | 8 | 20 | 80 | 39 | 82 | 76 | 8 | | | Zr: 30 |

| | Second additive element (B, P, Mg) ppm by mass | Third additive element (Se, Te, As, Sb) ppm by mass | Fourth additive element (Ga, Ge) mass % | Fifth additive element (In, Ag) ppm by mass | FAB shape | Bond reliability of 2nd bonding part | Initial bondability of 2nd bonding part | Bond reliability of 1st bonding part HAST | Bond reliability of 1st bonding part HTSL | Crushed shape |
|---|---|---|---|---|---|---|---|---|---|---|
| Examples | | Se: 20 | | | ◎ | ○ | ○ | ◎ | ○ | ◎ |
| | | | Ga: 0.011 | | ◎ | ◎◎ | ◎ | ○ | ◎ | ◎ |
| | P: 50 | | Ga: 0.1 | Ag: 500 | ○ | ◎ | ◎◎ | ○ | ◎ | ◎ |
| | P: 6 | Te: 100 | Ge: 1.1 | | ◎ | ◎ | ◎ | ◎ | ◎ | ◎ |
| | | Sb: 6 | Ga: 1.5 | In: 20 | ◎ | ◎◎ | ◎◎ | ◎ | ◎ | ◎ |
| | Mg: 100 | As: 100 | | | ◎ | ○ | ○ | ○ | ◎ | ◎ |
| | B: 15 | | | Ag: 6 | ◎ | ○ | ○ | ○ | ◎ | ◎ |
| | | | Ga: 0.6 | | ◎ | ○ | ○ | ○ | ◎ | ◎ |
| | | Te: 10 | Ga: 0.3 | | ◎ | ○ | ○ | ○ | ◎ | ◎ |
| | | | | | ◎ | ○ | ○ | ◎ | ◎ | ◎ |
| | | | Ge: 0.04 | | ◎ | ○ | ○ | ○ | ◎ | ◎ |
| | P: 65 | | | | ◎ | ◎◎ | ○ | ◎ | ◎ | ◎ |
| | | Sb: 15 | | | ○ | ◎ | ○ | ◎ | ◎ | ◎ |
| | | | | Ag: 120 | ◎ | ◎◎ | ◎◎ | ○ | ◎ | ◎ |

TABLE 2-continued

| | | | | | | | | |
|---|---|---|---|---|---|---|---|---|
| Comparative Examples | Mg: 25 | | ◎ | ○ | X | ○ | ○ | ○ |
| | | | ○ | X | X | ○ | ○ | ◎ |
| | Se: 10 | | ◎ | ○ | X | ◎ | ○ | ◎ |
| | | | X | X | X | ○ | ○ | X |
| | Ga: 0.05 | | X | ○ | X | ○ | ◎ | X |
| | | In: 16 | ○ | X | ○ | ○ | ○ | ◎ |
| | | | ◎ | ○ | X | X | X | ○ |
| | Te: 15 | | ◎ | X | ○ | ◎ | X | ◎ |

*[1] Average value X of ratio of Pd concentration $C_{Pd}$ (atomic %) to Ni concentration $C_{Ni}$ (atomic %), $C_{Pd}/C_{Ni}$, for all measurement points in coating layer
*[2] Proportion (%) of total number of measurement points in coating layer whose absolute deviation from average value X is 0.3X or less relative to total number of measurement points in coating layer
*[3] Proportion (%) of total number of measurement points in coating layer whose absolute deviation from average value X is 0.2X or less relative to total number of measurement points in coating layer

DESCRIPTION OF REFERENCE SIGNS

1 Bonding wire (wire)
2 Measuring surface
10 2nd bonding part
50 External terminal
X Center of width of wire
W Width of wire (wire diameter)
$w_a$ Width of measuring surface
$l_a$ Length of measuring surface
L1 Total width of 2nd bonding part
L2 Width of 2nd bonding part where wire and external terminal adhered with each other

The invention claimed is:

1. A bonding wire comprising:
a core material of Cu or Cu alloy; and
a coating layer having a total concentration of Pd and Ni of 90 atomic % or more formed on a surface of the core material, wherein
in a concentration profile in a depth direction of the bonding wire obtained by performing measurement using Auger electron spectroscopy (AES) so that the number of measurement points in the depth direction is 50 or more for the coating layer,
a thickness of the coating layer is 10 nm or more and 130 nm or less,
an average value X is 0.1 or more and 35.0 or less where X is defined as an average value of a ratio of a Pd concentration $C_{Pd}$ (atomic %) to an Ni concentration $C_{Ni}$ (atomic %), $C_{Pd}/C_{Ni}$, for all measurement points in the coating layer,
a total number of measurement points in the coating layer whose absolute deviation from the average value X is 0.3X or less is 50% or more relative to a total number of measurement points in the coating layer, and
the bonding wire satisfies the following condition (A):
(A) the bonding wire contains one or more elements (hereinafter referred to as a "first additive element") selected from the group consisting of Ti, V, Cr, Mn, Fe, Co, Zn, Zr, Nb, Mo, Ru, Rh, Sn, Ta, W, Os, Ir, Pt, Au and Bi, and a total concentration of the first additive element relative to the entire bonding wire is 5 ppm by mass or more and 450 ppm by mass or less.

2. The bonding wire according to claim 1, wherein the total number of measurement points in the coating layer whose absolute deviation from the average value X is 0.2X or less is 50% or more relative to the total number of the measurement points in the coating layer.

3. The bonding wire according to claim 1, wherein when linearly approximating $C_{Pd}$ or $C_{Ni}$ by the method of least squares for all measurement points in the coating layer to obtain an approximate straight line, a difference between a maximum value and a minimum value of the obtained approximate straight line in a depth range of the coating layer is 20 atomic % or less.

4. The bonding wire according to claim 1, wherein the concentration profile in the depth direction of the bonding wire is obtained by performing the measurement using AES under the following <Condition> while digging down the bonding wire from its surface in the depth direction by Ar sputtering:
<Condition> a center of width of a measuring surface is aligned with a center of width of the bonding wire, the width of the measuring surface is 5% or more and 15% or less of a diameter of the bonding wire, and a length of the measuring surface is five times the width of the measuring surface.

5. The bonding wire according to claim 1, wherein
the bonding wire contains one or more elements selected from the group consisting of B, P and Mg (hereinafter referred to as a "second additive element"), and
a total concentration of the second additive element is 1 ppm by mass or more and 100 ppm by mass or less relative to the entire bonding wire.

6. The bonding wire according to claim 1, wherein
the bonding wire contains one or more elements selected from the group consisting of Se, Te, As and Sb (hereinafter referred to as a "third additive element"), and
a total concentration of the third additive element is 1 ppm by mass or more and 100 ppm by mass or less relative to the entire bonding wire.

7. The bonding wire according to claim 1, wherein
the bonding wire contains one or more elements selected from the group consisting of Ga and Ge (hereinafter referred to as a "fourth additive element"), and
a total concentration of the fourth additive element is 0.011% by mass or more and 1.5% by mass or less relative to the entire bonding wire.

8. The bonding wire according to claim 1, wherein
the bonding wire contains one or more elements selected from the group consisting of In and Ag (hereinafter referred to as a "fifth additive element"), and
a total concentration of the fifth additive element is 1 ppm by mass or more and 500 ppm by mass or less relative to the entire bonding wire.

9. A bonding wire comprising:
a core material of Cu or Cu alloy; and
a coating layer having a total concentration of Pd and Ni of 90 atomic % or more formed on a surface of the core material, wherein
in a concentration profile in a depth direction of the bonding wire obtained by performing measurement using Auger electron spectroscopy (AES) so that the number of measurement points in the depth direction is 50 or more for the coating layer, a thickness of the coating layer is 10 nm or more and 130 nm or less, an average value X is 0.1 or more and 35.0 or less where X is defined as an average value of a ratio of a Pd concentration $C_{Pd}$ (atomic %) to an Ni concentration $C_{Ni}$ (atomic %), $C_{Pd}/C_{Ni}$, for all measurement points in the coating layer, a total number of measurement points in the coating layer whose absolute deviation from the average value X is 0.3X or less is 50% or more relative to a total number of measurement points in the coating layer, and the bonding wire satisfies the following conditions (A) and (B):

(A) the bonding wire contains one or more elements (hereinafter referred to as a "first additive element") selected from the group consisting of Ti, V, Cr, Mn, Fe, Co, Zn, Zr, Nb, Mo, Ru, Rh, Sn, Ta, W, Os, Ir, Pt, Au and Bi, and the total concentration of the first additive element relative to the entire bonding wire (provided that, the concentration of Au is the concentration thereof in the core material part) is 5 ppm by mass or more and 450 ppm by mass or less; and (B) the bonding wire contains Au at a surface of the wire, and a concentration of Au relative to the entire wire is 0.5% by mass or less.

10. The bonding wire according to claim 9, wherein the total number of measurement points in the coating layer whose absolute deviation from the average value X is 0.2X or less is 50% or more relative to the total number of the measurement points in the coating layer.

11. The bonding wire according to claim 9, wherein when linearly approximating $C_{Pd}$ or $C_{Ni}$ by the method of least squares for all measurement points in the coating layer to obtain an approximate straight line, a difference between a maximum value and a minimum value of the obtained approximate straight line in a depth range of the coating layer is 20 atomic % or less.

12. The bonding wire according to claim 9, wherein the concentration profile in the depth direction of the bonding wire is obtained by performing the measurement using AES under the following <Condition> while digging down the bonding wire from its surface in the depth direction by Ar sputtering:

<Condition> a center of width of a measuring surface is aligned with a center of width of the bonding wire, the width of the measuring surface is 5% or more and 15% or less of a diameter of the bonding wire, and a length of the measuring surface is five times the width of the measuring surface.

13. The bonding wire according to claim 9, wherein the bonding wire contains one or more elements selected from the group consisting of B, P and Mg (hereinafter referred to as a "second additive element"), and a total concentration of the second additive element is 1 ppm by mass or more and 100 ppm by mass or less relative to the entire bonding wire.

14. The bonding wire according to claim 9, wherein the bonding wire contains one or more elements selected from the group consisting of Se, Te, As and Sb (hereinafter referred to as a "third additive element"), and a total concentration of the third additive element is 1 ppm by mass or more and 100 ppm by mass or less relative to the entire bonding wire.

15. The bonding wire according to claim 9, wherein the bonding wire contains one or more elements selected from the group consisting of Ga and Ge (hereinafter referred to as a "fourth additive element"), and a total concentration of the fourth additive element is 0.011% by mass or more and 1.5% by mass or less relative to the entire bonding wire.

16. The bonding wire according to claim 9, wherein the bonding wire contains one or more elements selected from the group consisting of In and Ag (hereinafter referred to as a "fifth additive element"), and a total concentration of the fifth additive element is 1 ppm by mass or more and 500 ppm by mass or less relative to the entire bonding wire.

* * * * *